US 8,193,543 B2

(12) United States Patent
Leatherdale et al.

(10) Patent No.: US 8,193,543 B2
(45) Date of Patent: Jun. 5, 2012

(54) MONOCHROMATIC LIGHT SOURCE WITH HIGH ASPECT RATIO

(75) Inventors: Catherine A. Leatherdale, Woodbury, MN (US); Michael A. Haase, St. Paul, MN (US); Todd A. Ballen, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 13/058,315

(22) PCT Filed: Aug. 18, 2009

(86) PCT No.: PCT/US2009/054145
§ 371 (c)(1),
(2), (4) Date: Feb. 9, 2011

(87) PCT Pub. No.: WO2010/027649
PCT Pub. Date: Mar. 11, 2010

(65) Prior Publication Data
US 2011/0140128 A1    Jun. 16, 2011

Related U.S. Application Data

(60) Provisional application No. 61/094,180, filed on Sep. 4, 2008.

(51) Int. Cl.
*H01L 27/15* (2006.01)
(52) U.S. Cl. ............................................. 257/84; 257/78
(58) Field of Classification Search .................. 257/84, 257/78
See application file for complete search history.

(56) References Cited

U.S. PATENT DOCUMENTS

| 5,955,749 A | 9/1999 | Joannopoulos |
| 6,366,018 B1 | 4/2002 | Garbuzov |

(Continued)

FOREIGN PATENT DOCUMENTS

DE    10 2007 003 785    7/2008

(Continued)

OTHER PUBLICATIONS

Delbeke et al., "High Efficiency Semiconductor Resonant-Cavity Light-Emitting Diodes: A Review", IEEE Journal on Selected Topics in Quantum Electronics, pp. 189-206, vol. 8, No. 2, Mar./Apr. 2002.

(Continued)

Primary Examiner — Douglas Menz
(74) Attorney, Agent, or Firm — Kristofor L. Storvick

(57) ABSTRACT

Light emitting systems are disclosed. The light emitting system includes an LED that emits light at a first wave-length. A primary portion of the emitted first wavelength light exits the LED from a top surface of the LED that has a minimum lateral dimension Wmin. The remaining portion of the emitted first wavelength light exits the LED from one or more sides of the LED that has a maximum edge thickness Tmax (122, 124). The ratio Wmin/Tmax is at least 30. The light emitting system further includes a re-emitting semiconductor construction that includes a semiconductor potential well. The re-emitting semiconductor construction receives the first wavelength light that exits the LED from the top surface and converts at least a portion of the received light to light of a second wavelength. The integrated emission intensity of all light at the second wavelength that exit the light emitting system is at least 4 times the integrated emission intensity of all light at the first wavelength that exit the light emitting system.

20 Claims, 10 Drawing Sheets

U.S. PATENT DOCUMENTS

| | | |
|---|---|---|
| 6,831,302 B2 | 12/2004 | Erchak |
| 7,196,354 B1 | 3/2007 | Erchak |
| 7,361,938 B2 | 4/2008 | Mueller |
| 7,462,878 B2 | 12/2008 | Richter |
| 2004/0041220 A1 | 3/2004 | Kwak |
| 2005/0110034 A1 | 5/2005 | Fujiwara |
| 2006/0054905 A1 | 3/2006 | Schwach |
| 2006/0145123 A1 | 7/2006 | Li |
| 2006/0157720 A1 | 7/2006 | Bawendi |
| 2006/0214917 A1 | 9/2006 | Liu |
| 2007/0108888 A1 | 5/2007 | Chen |
| 2007/0176188 A1 | 8/2007 | Tanaka |
| 2007/0267646 A1 | 11/2007 | Wierer |
| 2007/0284567 A1 | 12/2007 | Pokrovskiy |
| 2010/0277054 A1 | 11/2010 | Takashima |

FOREIGN PATENT DOCUMENTS

| | | |
|---|---|---|
| EP | 1 403 934 | 9/2003 |
| EP | 1 411 557 | 10/2003 |
| EP | 1 643 567 | 8/2005 |
| GB | 2 451 365 | 1/2009 |
| JP | 2007-103511 | 4/2007 |
| JP | 2007-273506 | 10/2007 |
| JP | 11-330559 | 11/2009 |
| WO | WO 2006/135005 | 12/2006 |
| WO | WO 2007/007236 | 6/2007 |
| WO | WO 2008/078299 | 7/2008 |
| WO | WO 2010/027580 | 3/2010 |
| WO | WO 2010/027650 | 3/2010 |

OTHER PUBLICATIONS

Search Report for International Application No. PCT/US2009/054145, 5 pages, Date of Mailing Dec. 7, 2009.

Shen et al., "Optical cavity effects in InGaN/GaN quantum-well-heterostructure flip-chip light-emitting diodes," Applied Physics Letters, vol. 82, No. 14, pp. 2221-2223 (2003).

Tong, Q.-Y. and Gösele, U., "Semiconductor Wafer Bonding", Title Page and Table of Contents, John Wiley & Sons, New York, 1999.

U.S. Appl. No. 60/804,538, entitled "LED Device With Re-emitting Semiconductor Construction and Reflector", filed on Jun. 12, 2006.

U.S. Appl. No. 61/012,608, entitled "Semiconductor Light Emitting Device and Method of Making Same", filed on Dec. 10, 2007.

U.S. Appl. No. 60/893,804, entitled "Array of Luminescent Elements", filed on Mar. 8, 2007.

U.S. Appl. No. 61/094,192, entitled " Light Source with Improved Monochromaticity", filed on Sep. 4, 2008.

U.S. Appl. No. 61/094,197, entitled "Light Source Having Light Blocking Components", filed on Sep. 4, 2008.

U.S. Appl. No. 61/094,270, entitled "Diode-pumped Light Source", filed on Sep. 4, 2008.

U.S. Appl. No. 61/094,267, entitled "Monochromatic Light Source", filed on Sep. 4, 2008.

Written Opinion for International Application No. PCT/US2009/054145, 6 pages, Date of Mailing Dec. 7, 2009.

MONOCHROMATIC LIGHT SOURCE WITH HIGH ASPECT RATIO

Cross Reference to Related Applications

This application is a national stage filing under 35 U.S.C. 371 of PCT/US2009/054145, filed on Aug. 18, 2009, which claims priority to U.S. Provisional Application No. 61/094,180, filed on Sep. 4, 2008, the disclosure of which is incorporated by reference in its/their entirety herein.

FIELD OF THE INVENTION

This invention generally relates to semiconductor light emitting devices. The invention is particularly applicable to monochromatic semiconductor light emitting devices.

BACKGROUND

Monochromatic light emitting diodes (LEDs) are becoming increasingly important for optical, such as illumination, applications. One example of such an application is in the back-illumination of displays, such as liquid crystal display (LCD) computer monitors and televisions. Wavelength converted light emitting diodes are increasingly used in applications where there is a need for light of a color that is not normally generated, or is not generated efficiently, by an LED. Some known light emitting devices include a light source, such as an LED, that emits, for example, blue light and a light converting layer for converting the blue light to, for example, red light. In such known devices, however, some of the unconverted blue light leaks and mixes with the red light resulting in non-monochromatic light. Furthermore, the spectral characteristics of such known light emitting devices vary as a function of direction.

SUMMARY OF THE INVENTION

Generally, the present invention relates to semiconductor light emitting devices. In one embodiment, a light emitting system includes an LED that emitting light at a first wavelength. A primary portion of the emitted first wavelength light exits the LED from a top surface of the LED that has a minimum lateral dimension $W_{min}$. The remaining portion of the emitted first wavelength light exits the LED from one or more sides of the LED that have a maximum edge thickness $T_{max}$. The ratio $W_{min}/T_{max}$ is at least 30. The light emitting system further includes a re-emitting semiconductor construction that includes a semiconductor potential well. The re-emitting semiconductor construction receives the first wavelength light that exits the LED from the top surface and converts at least a portion of the received light to light of a second wavelength. The integrated emission intensity of all light at the second wavelength that exit the light emitting system is at least 4 times the integrated emission intensity of all light at the first wavelength that exit the light emitting system. In some cases, light that is emitted by the light emitting system along a first direction has a first set of color coordinates and light that is emitted by the light emitting system along a second direction has a second set of color coordinates that are substantially the same as the first set of color coordinates. The angle between the first and second directions is no less than 20 degrees. In some cases, the first set of color coordinates are $u_1'$ and $v_1'$ and the second set of color coordinates are $u_2'$ and $v_2'$, and the absolute value of each of differences between $u_1'$ and $u_2'$ and between $v_1'$ and $v_2'$ is no more than 0.01. In some cases, the top surface is a rectangle that has a length L and a width W, where the width is the minimum lateral dimension of the top surface. In some cases, the re-emitting semiconductor construction converts at least 20% of the received light to light of the second wavelength.

In another embodiment, a light emitting system includes an LED that emits light at a first wavelength and includes a pattern that enhances emission of light from a top surface of the LED and suppresses emission of light from one or more sides of the LED. The light emitting system further includes a re-emitting semiconductor construction that includes a II-VI potential well and receives the first wavelength light that exits the LED and converts at least a portion of the received light to light of a second wavelength. The integrated emission intensity of all light at the second wavelength that exit the light emitting system is at least 4 times the integrated emission intensity of all light at the first wavelength that exit the light emitting system. In some cases, the pattern is periodic. In some cases, the pattern is aperiodic. In some cases, the pattern is quasi-periodic. In some cases, the LED includes one or more layers and the pattern includes a thickness pattern in some of the layers. In some cases, a potential well within the LED includes the pattern. In some cases, a substantial portion of the first wavelength light that exits the LED and is received by the re-emitting semiconductor construction, exits the LED through the top surface of the LED. In some cases, light that is emitted by the light emitting system along a first direction has a first set of color coordinates and light that is emitted by the light emitting system along a second direction has a second set of color coordinates that are substantially the same as the first set of color coordinates. In such cases, the angle between the first and second directions is no less than 20 degrees. In some cases, the first set of color coordinates are $u_1'$ and $v_1'$ and the second set of color coordinates are $u_2'$ and $v_2'$, where the absolute value of each of differences between $u_1'$ and $u_2'$ and between $v_1'$ and $v_2'$ is no more than 0.01.

In another embodiment, a light emitting system includes an electroluminescent device that emits light at a first wavelength and has a shape that enhances emission of light from the top surface of the electroluminescent device and suppresses emission of light from one or more sides of the electroluminescent device. The light emitting system further includes a re-emitting semiconductor construction that includes a II-VI potential well and receives the first wavelength light that exits the electroluminescent device from the top surface and converts at least a portion of the received light to light of a second wavelength. The integrated emission intensity of all light at the second wavelength that exit the light emitting system is at least 4 times the integrated emission intensity of all light at the first wavelength that exit the light emitting system. In some cases, the shape of the electroluminescent device is such that a substantial portion of the first wavelength light that propagate within the electroluminescent device toward a side of the electroluminescent device is redirected toward the top surface. In some cases, the electroluminescent device has a first side and a second side that is not parallel to the first side. In some cases, the electroluminescent device has a substantially trapezoidal cross-section in a plane normal to the top surface. In some cases, the II-VI potential well includes Cd(Mg)ZnSe or ZnSeTe.

In another embodiment, a light emitting system includes an electroluminescent device that emits light at a first wavelength from a top surface of the electroluminescent device. The light emitting system further includes a construction proximate a side of the electroluminescent device for blocking light at the first wavelength that would otherwise exit the side. The light emitting system further includes a re-emitting semiconductor construction that includes a II-VI potential well and receives the first wavelength light that exits the electroluminescent device and converts at least a portion of the received light to light of a second wavelength. The integrated emission intensity of all light at the second wavelength that exit the light emitting system is at least 4 times the integrated emission intensity of all light at the first wavelength that exit the light emitting system. In some cases, the construction proximate the side of the electroluminescent device for blocking light at the first wavelength blocks the light primarily by absorbing the light. In some cases, the construction proximate the side of the electroluminescent device for blocking light at the first wavelength blocks the light primarily by reflecting the light. In some cases, the construction proximate the side of the electroluminescent device blocks light at the first wavelength, but not other wavelengths, in the visible range of the electromagnetic spectrum. In some cases, the construction is electrically insulative and directly contacts at least one electrode of the electroluminescent device. In some cases, the construction also blocks light at the first or second wavelength that would otherwise exit a side of the re-emitting semiconductor construction. In some cases, a substantial portion of the first wavelength light that exits the electroluminescent device and is received by the re-emitting semiconductor construction, exits the electroluminescent device through the top surface of the electroluminescent device. In some cases, the light emitting system also includes an intermediate region between the construction and the side proximate the construction.

In another embodiment, a light emitting system includes a light reflector that reflects light at a first wavelength $\lambda_1$. The light emitting system further includes an electroluminescent device that is disposed on the light reflector and emits light at the first wavelength. The electroluminescent device has an active region for generating photons at the first wavelength. The distance between the active region and the light reflector is such that emission of light from the top surface of the electroluminescent device is enhanced and emission of light from one or more sides of the electroluminescent device is suppressed. The light emitting system further includes a re-emitting semiconductor construction that includes a II-VI potential well and receives the first wavelength light that exits the electroluminescent device from the top surface and converts at least a portion of the received light to light of a second wavelength. The integrated emission intensity of all light at the second wavelength that exit the light emitting system is at least 4 times the integrated emission intensity of all light at the first wavelength that exit the light emitting system. In some cases, the light reflector includes a metal. In some cases, the light reflector includes a Bragg reflector. In some cases, the light reflector is capable of laterally spreading an electric current across the LED. In some cases, the distance between the active region and the light reflector is in a range from about $0.6\lambda_1$ to about $1.4\lambda_1$. In some cases, this distance is in a range from about $0.6\lambda_1$ to about $0.8\lambda_1$. In some cases, this distance is in a range from about $1.2\lambda_1$ to about $1.4\lambda_1$. In some cases, light that is emitted by the light emitting system along a first direction has a first set of color coordinates and light that is emitted by the light emitting system along a second direction has a second set of color coordinates that are substantially the same as the first set of color coordinates. In such cases, the angle between the first and second directions is no less than 20 degrees. In some cases, the first set of color coordinates are $u_1'$ and $v_1'$ and the second set of color coordinates are $u_2'$ and $v_2'$, and the absolute value of each of differences between $u_1'$ and $u_2'$ and between $v_1'$ and $v_2'$ is no more than 0.01.

BRIEF DESCRIPTION OF DRAWINGS

The invention may be more completely understood and appreciated in consideration of the following detailed description of various embodiments of the invention in connection with the accompanying drawings, in which.

The same reference numeral used in multiple figures refers to the same or similar elements having the same or similar properties and functionalities.

DETAILED DESCRIPTION

Figure 1:
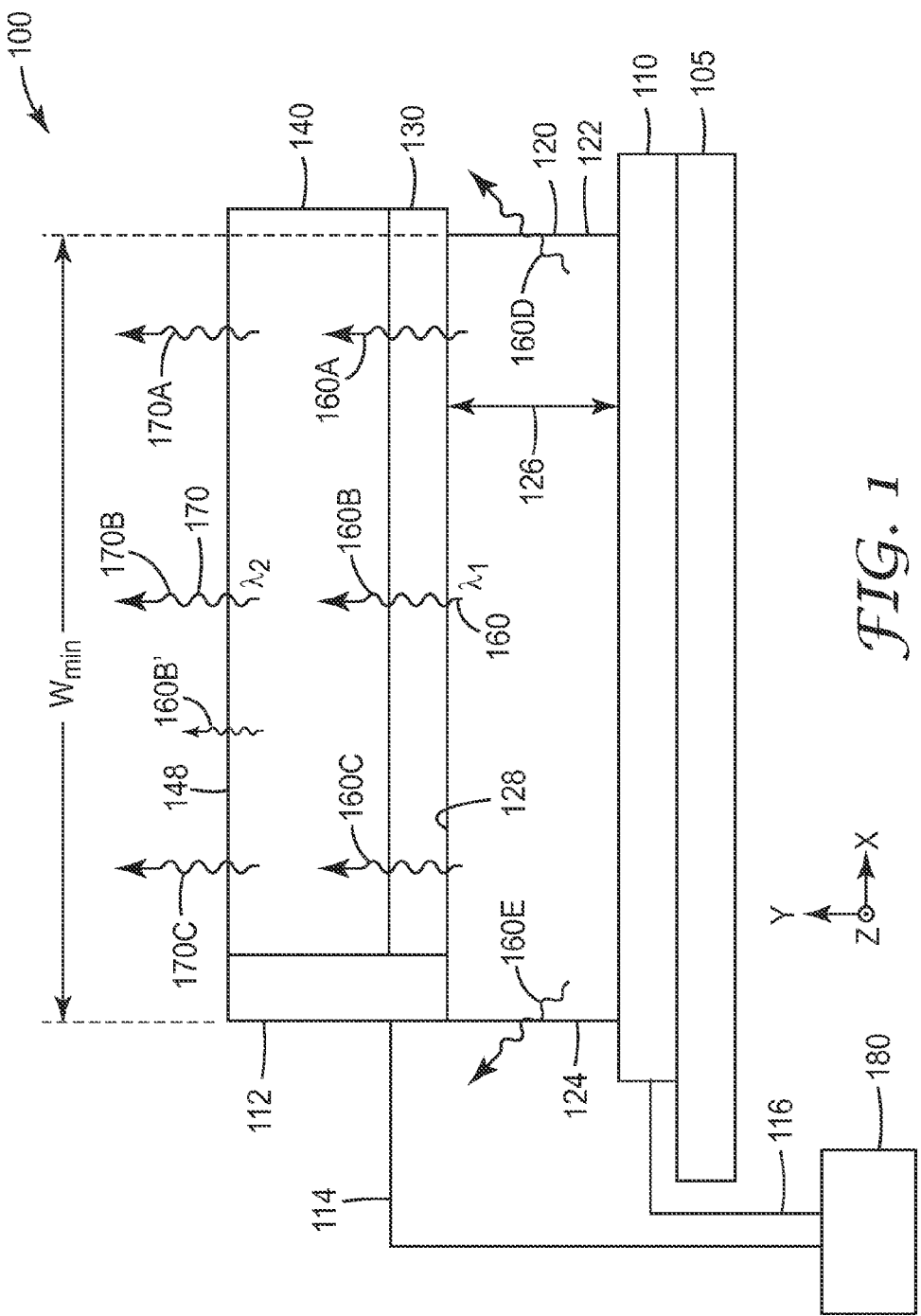
FIG. 1 is a schematic side-view of a light emitting system.

This application discloses semiconductor light emitting devices that include a semiconductor light source and one or more wavelength converters, where a converter can be a semiconductor wavelength converter. In particular, the disclosed devices are monochromatic meaning that the spectral distribution of the emitted light has a single peak corresponding to the emission wavelength and a small full spectral width at half maximum (FWHM). In such cases, the FWHM can be less than about 50 nm, or less than about 10 nm, or less than about 5 nm, or less than about 1 nm. In some cases, wavelength $\lambda_1$ of the semiconductor light source can be in a range from about 350 nm to about 650 nm, or from about 350 nm to about 600 nm, or from about 350 nm to about 550 nm, or from about 350 nm to about 500 nm, or from about 350 nm to about 450 nm. For example, wavelength $\lambda_1$ can be about 365 nm or about 405 nm.

Some disclosed devices have substantially the same spectral characteristics for light emitted in different directions. For example, the color coordinates of the emitted light can be substantially the same for light exiting the device along different directions. Some of the disclosed monochromatic devices employ light emitting diodes (LEDs) and light converters, such as phosphors or semiconductor light converting potential wells or quantum wells. The disclosed devices can display improved spectral stability as a function of emission direction.

Some disclosed devices have a light source and a light converting layer from the same semiconductor group, such as the III-V semiconductor group. In such cases, it may be feasible to monolithically grow and fabricate, for example, a III-V wavelength converter directly onto a III-V light source, such as a III-V LED. In some cases, however, a wavelength converter capable of emitting light at a desired wavelength with high conversion efficiency and/or other desirable properties, may be from a semiconductor group that is different than the semiconductor group the LED belongs to. In such cases, it may not be possible or feasible to grow one component onto the other with high quality. For example, a high efficiency stable wavelength converter can be from the II-VI group and a light source, such as an LED, can be from the III-V group. In such cases, various methods can be employed for attaching the light converter to the light source. Some such methods are described in U.S. Patent Application Ser. No. 61/012,608, filed Dec. 10, 2007, which is incorporated herein in its entirety by reference.

In some applications, it may be desirable to have a light source emitting light at a desired single wavelength, such as a green wavelength. In such applications, however, small and efficient light sources may not be available. In such applications, a device disclosed in this application can be advantageously used where the device can include a monochromatic III-V LED emitting light at a single wavelength different, such as smaller, than the desired wavelength and an efficient II-VI potential well for converting, such as down converting, the emitted light to the desired single wavelength. In addition to improved monochromaticity, the devices disclosed in this application can have other potential advantages, such as high conversion efficiency, low manufacturing cost and/or small size. As used herein, down converting means that the photon energy of the converted light is less than the photon energy of the unconverted or incident light. That is, the wavelength of the converted light is greater than the wavelength of the incident light.

In some cases, the disclosed light emitting devices can be used to make a pixelated display by forming an array of pixel-size light sources. In such cases, a displayed image can have spectral characteristics that do not change, or change very little, as a function of emission or viewing direction.

In some cases, arrays of light emitting devices disclosed in this application can be used in illumination systems, such as adaptive illumination systems, for use in, for example, projection systems or other optical systems.

FIG. 1 is a schematic light emitting system 100 that includes a substrate 105, a bottom electrode 110 disposed on the substrate, an LED 120 emitting light at a first wavelength $\lambda_1$ and making electrical contact with the bottom electrode, a re-emitting construction 140 disposed on the LED for converting at least a portion of light emitted by the LED at $\lambda_1$ to light at a longer wavelength $\lambda_2$, an optional bonding layer 130 for attaching the re-emitting construction to the LED, a top electrode 112 in electrical contact with the LED, and a power supply 180 for energizing the LED connected to electrodes 110 and 112 with respective electric leads 116 and 114.

LED 120 is substantially a monochromatic LED emitting light 160 at a first peak wavelength $\lambda_1$ with a small full spectral-width at half maximum (FWHM). For example, the FWHM can be less than about 50 nm, or less than about 30 nm, or less than about 15 nm, or less than about 10 nm, or less than about 5 nm, or less than about 1 nm.

LED 120 has an active top or emission surface 128 that can have any shape that may be desirable and/or available in an application, where by an active top surface it is meant that light that is emitted by the LED through the top surface covers substantially the entire top surface. Top surface 128 has a minimum lateral dimension $W_{min}$. For example, emission surface 128 can be a square, in which case, the minimum lateral dimension $W_{min}$ is equal to the width of the square. As another example, the top surface can be a rectangle having a length L and a width W less than L, in which case, the minimum lateral dimension $W_{min}$ of the top surface is W. In such cases, the width W can be in a range from about 50 μm to about 1000 μm, or from about 100 μm to about 600 μm, or from about 200 μm to about 500 μm. In some cases, W can be about 250 μm, or about 300 μm, or about 350 μm, or about 4000 μm, or about 4500 μm. In some cases, the width W can be in a range from about 1 μm to about 50 μm, or from about 1 μm to about 40 μm, or from about 1 μm to about 30 μm.

The length L can be in a range from about 500 μm to about 3000 μm, or from about 700 μm to about 2500 μm, or from about 900 μm to about 2000 μm, or from about 1000 μm to about 2000 μm. In some cases, L can be about 1100 μm, or about 1200 μm, or about 1500 μm, or about 1700 μm, or about 1900 μm. As yet another example, the top surface can be a circle having a diameter D, in which case, the minimum lateral dimension $W_{min}$ of the top surface is D.

In some cases, active top or emission surface 128 of LED 120 can be modified to define a new active top surface. For example, the active top surface of an LED can be selectively patterned using, for example, an opaque coating to define a new active top surface. In general, the active top surface is the primary emission or exit area of the LED through which the emitted light rays exit the LED toward re-emitting construction 140. In such cases, the emitted light rays exit the LED from substantially the entire top surface.

In general, light emitted by the LED can propagate along different directions. In some cases, different emitted light rays can propagate along different directions. In some cases, an emitted light ray initially propagating along a given direction can change direction due to, for example, reflection by or scattering from, for example, an internal surface of the LED. In some cases, some light rays, such as light rays 160A, 160B and 160C, may propagate in an upward direction and exit top surface 128 towards re-emitting construction 140. Some other light rays may propagate in different directions and exit the LED from areas other than top surface 128. For example, light ray 160D exits the LED from a first side 122 of the LED and light ray 160E exits the LED from a second side 124 of the LED. In some cases, such light rays do not enter re-emitting construction 140 and, therefore, can not be converted to light at wavelength $\lambda_2$. Such light rays, however, can eventually exit light emitting system 100 as part of the output light beam, in which case, the output beam can have light at wavelengths $\lambda_1$ and $\lambda_2$ both. In some cases, any light at $\lambda_1$ that is leaked by light emitting system 100 propagates along certain, but not all, directions. In such cases, the output light of the system can have different spectral characteristics, such as different colors, along different directions.

In some cases, a primary portion of the emitted first wavelength light exits LED 120 from active top surface 128 as light 160 at $\lambda_1$ towards re-emitting construction 140. In such cases, at least 70%, or at least 80%, or at least 90%, or at least 95% of light at wavelength $\lambda_1$ that exits the LED goes through the top surface towards re-emitting construction 140. The remaining portion of the emitted first wavelength light, that is, light that does not exit the LED through top surface 128, exits the LED from, for example, one or more sides of the LED, such as sides 122 and 124 of the LED.

The sides, including for example side 122, of the LED define a largest exit or clear aperture having a maximum height $T_{max}$ through which light at the first wavelength $\lambda_1$ can exit the LED. In general, $T_{max}$ corresponds to the sum of the thicknesses of the various layers in the LED that are at least substantially optically transparent at $\lambda_1$. In some cases, $T_{max}$ corresponds to the sum of the thicknesses of all of the semiconductor layers in the LED. In some cases, $T_{max}$ corresponds to the maximum edge thickness of the LED excluding the edge portions that are not transparent at $\lambda_1$. In some cases, $T_{max}$ is in a range from about 1 µm to about 1000 µm, or from about 2 µm to about 500 µm, or from about 3 µm to about 400 µm. In some cases, $T_{max}$ is about 4 µm, or about 10 µm, or about 20 µm, or about 50 µm, or about 100 µm, or about 200 µm, or about 300 µm. In some cases, the ratio $W_{min}/T_{max}$ is large enough so that the primary portion of light exiting the LED at $\lambda_1$, exits through top surface 128 and a smaller remaining portion exits through other areas, such as the sides, of the LED. For example, in such cases, the ratio $W_{min}/T_{max}$ is at least about 30, or at least about 40, or at least about 50, or at least about 70, or at least about 100, or at least about 200, or at least about 500.

Re-emitting construction 140 receives the first wavelength ($\lambda_1$) light exiting LED 120 from top surface 128 of the LED and down converts at least a portion of the received light to a substantially monochromatic light 170 having a second peak wavelength $\lambda_2$ with a full spectral-width at half maximum (FWHM) of less than about 50 nm, or less than about 30 nm, or less than about 15 nm, or less than about 10 nm, or less than about 5 nm, or less than about 1 nm. As indicated schematically in FIG. 1, the re-emitting construction converts at least a portion of light ray 160A having wavelength $\lambda_1$ to light ray 170A having wavelength $\lambda_2$, at least a portion of light ray 160B having wavelength $\lambda_1$ to light ray 170B having wavelength $\lambda_2$, and at least a portion of light ray 160C having wavelength $\lambda_1$ to light ray 170C having wavelength $\lambda_2$, although, in general, a converted light ray can propagate along a direction that is different than the direction of the corresponding incident light ray. For example, incident light ray 160A can propagate along the y-axis as schematically shown in FIG. 1, and converted light ray 170A can propagate along, for example, the x-axis or along a direction that lies somewhere between the x- and the y-axes.

In some cases, a portion of a light ray, such as light ray 160B, may not be converted by the re-emitting construction. In such cases, at least a portion of the unconverted light at $\lambda_1$, can be transmitted by re-emitting construction 140 through an active top or emission surface 148 of the re-emitting construction as light 160B'. In some cases, re-emitting construction 140 converts at least 20%, or at least 30%, or at least 40%, or at least 50%, or at least 60%, or at least 70%, or at least 80%, or at least 90%, of the first wavelength that it receives from LED 120 to light of the second wavelength.

In the exemplary light emitting system 100, light 170 exits the light emitting system from the active top surface of the re-emitting construction, although, in some cases, some of the converted light may escape the light emitting system from locations other than top surface 148. For example, some converted light rays, not shown explicitly in FIG. 1, may exit the light emitting system from one or more sides of the re-emitting construction. As another example, some converted light rays may exit the light emitting system through sides 122 and 124 of LED 120 after, for example, undergoing one or more reflections from the internal surfaces of the light emitting system.

In general, re-emitting construction 140 can include any construction or material capable of converting at least a portion of light 160 to light 170. For example, re-emitting construction 140 can include a phosphor, a fluorescent dye, a conjugated light emitting organic material such as a polyfluorene, or a photoluminescent semiconductor layer. Exemplary phosphors that may be used in re-emitting construction 140 include strontium thiogallates, doped GaN, copper-activated zinc sulfide, and silver-activated zinc sulfide. Other useful phosphors include doped YAG, silicate, silicon oxynitride, silicon nitride, and aluminate based phosphors. Examples of such phosphors include Ce:YAG, SrSiON:Eu, SrBaSiO:Eu, SrSiN:Eu, and BaSrSiN:Eu.

In some cases, re-emitting construction 140 can include a slab phosphor such as a Ce:YAG slab. A Ce:YAG slab can be made by, for example, sintering Ce:YAG phosphor particles at elevated temperatures and pressures to form a substantially optically transparent and non-scattering slab as described in, for example, U.S. Pat. No. 7,361,938.

In some cases, re-emitting construction 140 can include a potential well, a quantum well, a quantum wire, a quantum dot, or multiples or a plurality of each. Inorganic potential and quantum wells, such as inorganic semiconductor potential and quantum wells, typically have increased light conversion efficiencies compared to, for example, organic materials, and are more reliable by being less susceptible to environmental elements such as moisture. Furthermore, inorganic potential and quantum wells tend to have narrower output spectra resulting in, for example, improved color gamut.

As used herein, potential well means semiconductor layer(s) in a multilayer semiconductor structure designed to confine a carrier in one dimension only, where the semiconductor layer(s) has a lower conduction band energy than the surrounding layers and/or a higher valence band energy than the surrounding layers. Quantum well generally means a potential well which is sufficiently thin that quantization effects increase the energy for electron-hole pair recombination in the well. A quantum well typically has a thickness of about 100 nm or less, or about 10 nm or less. A quantum wire provides carrier confinement along two orthogonal directions and typically has a thickness of about 100 nm or less, or about 10 nm or less, along each carrier confinement direction. A quantum dot provides carrier confinement along three mutually orthogonal directions and typically has a maximum dimension of about 100 nm or less, or about 10 nm or less.

In some cases, LED 120 has an emission spectrum with one or more peaks with wavelength $\lambda_1$ being the wavelength of one of the peak emissions. In some cases, LED 120 emits light essentially at a single wavelength $\lambda_1$, meaning that the emitted spectrum has a narrow peak at $\lambda_1$ and a small full spectral-width at half maximum (FWHM). In such cases, the FWHM can be less than about 50 nm, or less than about 10 nm, or less than about 5 nm, or less than about 1 nm. In some cases, the LED light source can be a III-V LED light source. In some cases, the LED light source can be replaced with a laser diode light source, such as III-V laser diode light source. In some cases, the pump wavelength $\lambda_1$ is between about 350 nm and about 500 nm. For example, in such cases, $\lambda_1$ can be about 405 nm.

In some cases, light that exits light emitting system 100 is substantially monochromatic, meaning that the exiting light is substantially light at the second wavelength $\lambda_2$ and includes little or no first wavelength light. In such cases, the integrated or total emission intensity of all light at the second wavelength $\lambda_2$ that exits light emitting system 100 is at least 4 times, or at least 10 time, or at least 20 times, or at least 50 times the integrated or total emission intensity of all light at the first wavelength $\lambda_1$ that exit the light emitting system. Integrated emission intensity of light emitting system 100 can be determined by integrating the output intensity of the system at one or more wavelengths over all emission angles and directions which, in some cases, can be 4π square radians or 4π steradians.

Figure 2:
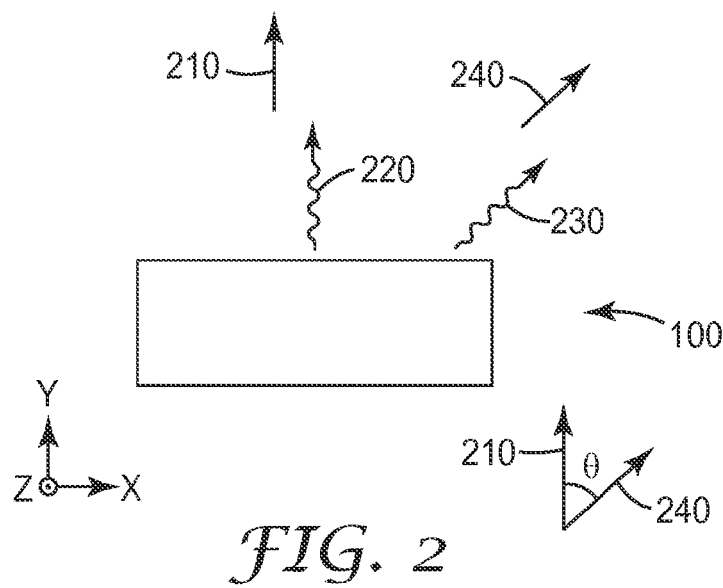
FIG. 2 is a schematic side-view of a light emitting system emitting light along different exemplary directions.

In some cases, light exiting light emitting system 100 along different directions can have different spectral, such as color, properties. For example, light traveling along different directions can have different proportions of the first and second wavelengths light. For example, FIG. 2 schematically shows light emitting system 100 emitting light 220 substantially along a first direction 210 (y-axis) and light 230 substantially along a different second direction 240. In some cases, lights 220 and 230 can have different spectral properties. For example, light 220 can have a larger second wavelength content than light 230. In some cases, such as when the ratio $W_{min}/T_{max}$ is sufficiently large, lights 220 and 230 can have substantially the same spectral characteristics. For example, in some cases, light 220 can have a first color $C_1$ with color coordinates $x_1$ and $y_1$ and light 230 can have a second color $C_2$ with color coordinates $x_2$ and $y_2$ where colors $C_1$ and $C_2$ are substantially the same. In such cases, the absolute value of each of the differences between $x_1$ and $x_2$ and between $y_1$ and $y_2$ is no more than about 0.01, or no more than about 0.005, or no more than about 0.002, or no more than about 0.001, or no more than about 0.0005.

In some cases, the angle θ between first and second directions 210 and 240, respectively, is not less than about 10 degrees, or not less than about 15 degrees, or not less than about 20 degrees, or not less than about 25 degrees, or not less than about 30 degrees, or not less than about 35 degrees, or not less than about 40 degrees, or not less than about 45 degrees, or not less than about 50 degrees, or not less than about 55 degrees, or not less than about 60 degrees, or not less than about 65 degrees, or not less than about 70 degrees.

In general, LED 120 can be any LED capable of emitting light at a desired wavelength. For example, in some cases, LED 120 can be an LED emitting UV, violet or blue light. In some cases, LED 120 can include one or more p-type and/or n-type semiconductor layers, one or more active layers that may include one or more potential and/or quantum wells, buffer layers, substrate layers, and superstate layers.

In some cases, LED 120 can be a III-V semiconductor LED and can include an AlGaInN semiconductor alloy. For example, LED 120 can be a GaN based LED. In some cases, an emission spectrum, such as a color spectrum, of LED 120 can be substantially independent from the size or magnitude of the input excitation signal applied to the LED by power supply 180. For example, in some cases, such as when LED 120 is a GaN based LED, when the excitation signal or output of power supply 180 changes from about 50% to about 100% of the maximum rating of the excitation signal, each of the color coordinates $x_1$ and $y_1$ of light 160 emitted by LED 120 at wavelength $\lambda_1$ changes by no more than about 1%, or by no more than about 0.5%, or by no more than about 0.1%.

In some cases, such as when LED 120 is a GaN based LED and re-emitting construction 140 includes one or more II-VI potential wells, when the excitation signal or output of power supply 180 changes by about 50% to about 100% of the maximum rating of the excitation signal, each of the color coordinates $x_2$ and $y_2$ of light 170 at wavelength $\lambda_2$ changes by no more than about 1%, or by no more than about 0.5%, or by no more than about 0.1%.

In some cases, re-emitting construction 140 converts at least a portion of incident light 160 at first wavelength $\lambda_1$ to output light 170 at wavelength $\lambda_2$ by absorbing at least a portion of the first wavelength light and re-emitting at least a portion of the absorbed light as the second wavelength light, where the second wavelength $\lambda_2$ is larger than the first wavelength $\lambda_1$. For example, in some cases, the first wavelength $\lambda_1$ is UV, violet or blue and the second wavelength $\lambda_2$ is blue, green, yellow, amber or red.

Figure 3:
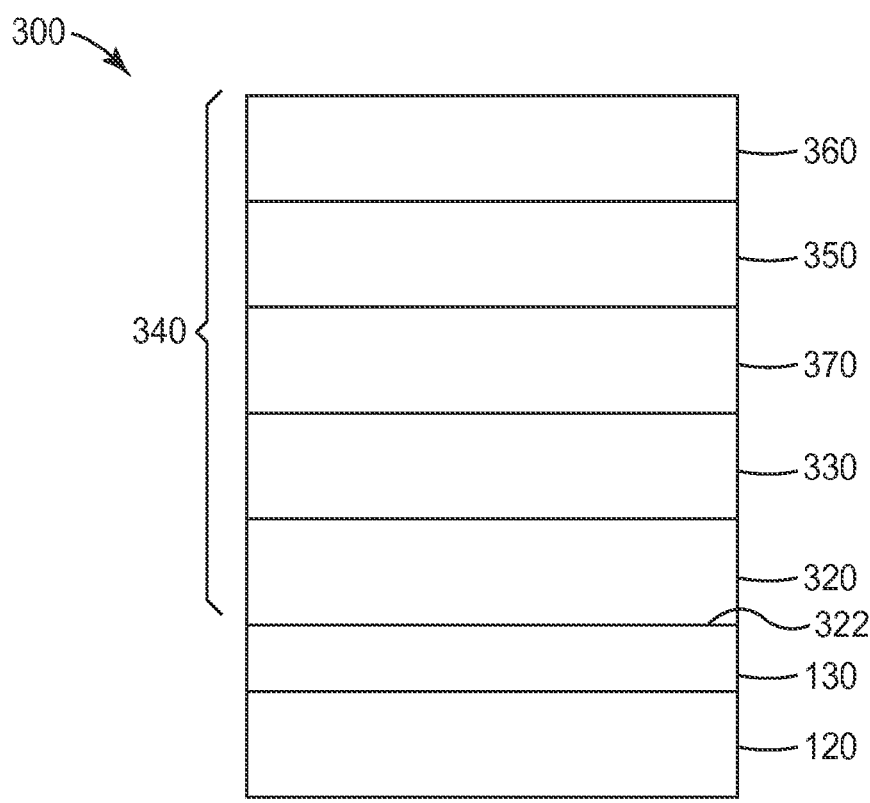
FIG. 3 is a schematic side-view of a re-emitting construction.

FIG. 3 is a schematic of various exemplary layers that can be included in a re-emitting construction 340 similar to 140. In particular, re-emitting construction 340 includes respective first and second windows 320 and 360, respective first and second light absorbing layers 330 and 350, and a potential well 370.

In some cases, a potential well 370 is a II-VI semiconductor potential well that has a transition energy $E_{pw}$ that is smaller than the energy $E_1$ of a photon emitted by LED 120. In general, the transition energy of potential well 370 is substantially equal to the energy $E_2$ of a photon that is re-emitted by the potential or quantum well.

In some cases, potential well 370 can include CdMgZnSe alloys having compounds ZnSe, CdSe, and MgSe as the three constituents of the alloy. In some cases, one or more of Cd, Mg, and Zn, especially Mg, may be absent from the alloy. For example, potential well 370 can include a $Cd_{0.70}Zn_{0.30}Se$ quantum well capable of re-emitting in the red, or a $Cd_{0.33}Zn_{0.67}Se$ quantum well capable of re-emitting in the green. As another example, potential well 370 can include an alloy of Cd, Zn, Se, and optionally Mg, in which case, the alloy system can be represented by Cd(Mg)ZnSe. As another example, potential well 370 can include an alloy of Cd, Mg, Se, and optionally Zn. In some cases, the potential well can include ZnSeTe. In some cases, a quantum well 370 has a thickness in a range from about 1 nm to about 100 nm, or from about 2 nm to about 35 nm.

In general, potential well 370 can have any conduction and/or valence band profile. Exemplary profiles are described in, for example, U.S. Patent Application No. 60/893,804 which is incorporated herein by reference in its entirety.

In some cases, potential well 370 can be n-doped or p-doped where the doping can be accomplished by any suitable method and by inclusion of any suitable dopant. In some cases, LED 120 and re-emitting construction 340 can be from two different semiconductor groups. For example, in such cases, LED 120 can be a III-V semiconductor device and re-emitting construction 340 can be a II-VI potential well. In some cases, LED 120 can include AlGaInN semiconductor alloys and re-emitting construction 340 can include Cd(Mg)ZnSe semiconductor alloys where a material enclosed in parentheses is an optional material.

The exemplary re-emitting construction 340 includes one potential well. In some cases, re-emitting construction 340 can have multiple potential wells. For example, in such cases, re-emitting construction 340 can have at least 2 potential wells, or at least 5 potential wells, or at least 10 potential wells. In some cases, re-emitting construction 340 can have at least two potential wells, or at least three potential wells, or at least four potential wells, with at least some of the potential wells having different transition energies.

In some cases, potential well 370 substantially absorbs light at the first wavelength $\lambda_1$. For example, in such cases, potential well 370 absorbs at least 30%, or at least 40%, or at least 50% of light at the first wavelength $\lambda_1$ that enters the potential well. In some cases, potential well 370 is substantially optically transmissive at the first wavelength $\lambda_1$. For example, in such cases, potential well 370 transmits at least 60%, or at least 70%, or at least 80%, or at least 90% of light at the first wavelength $\lambda_1$ that enters the potential well.

In some cases, re-emitting construction 340 includes at least one layer of a II-VI compound. For example, in such cases, re-emitting construction 340 can include one or more II-VI potential wells capable of converting at least a portion of a light, such as a UV, violet, or blue light that is emitted by LED 120, to a longer wavelength, such as green or red, light.

First and second light absorbing layers 330 and 350 are proximate potential well 370 to assist in absorbing light that is emitted by LED 120. In some cases, the absorbing layers include one or more materials so that a photogenerated carrier within the one or more materials, can efficiently diffuse to the potential well. In some cases, the light absorbing layers can include a semiconductor, such as an inorganic semiconductor, such as a II-VI semiconductor. For example, at least one of absorbing layers 330 and 350 can include a Cd(Mg)ZnSe semiconductor alloy.

In some cases, a light absorbing layer has a band gap energy that is smaller than the energy of a photon emitted by LED 120. In such cases, the light absorbing layer can strongly absorb light that is emitted by the light source. For example, in such cases, the light absorbing layers in re-emitting construction 340 can absorb at least 50%, or at least 60%, or at least 70%, or at least 70%, or at least 80%, or at least 90%, or at least 95% of the incident light at the first wavelength $\lambda_1$ that enters re-emitting construction 340 from LED 120. In some cases, a light absorbing layer has a band gap energy that is greater than the transition energy of potential well 370. In such cases, the light absorbing layer is substantially optically transparent to light that is re-emitted by the potential well. For example, in such cases, the light absorbing layers in re-emitting construction 340 can transmit at least 50%, or at least 60%, or at least 70%, or at least 70%, or at least 80%, or at least 90%, or at least 95% of light at the second wavelength $\lambda_2$ that is emitted by potential well 370.

In some cases, at least one of light absorbing layers 330 and 350 can be closely adjacent to potential well 370, meaning that one or a few intervening layers may be disposed between the absorbing layer and the potential well. In some cases, at least one of light absorbing layers 330 and 350 can be immediately adjacent to potential well 370, meaning that no intervening layer is disposed between the absorbing layer and the potential well.

The exemplary re-emitting construction 340 includes two light absorbing layers 330 and 350. In general, a light converting layer can have no, one, two or more light absorbing layers. In general, a light absorbing layer is sufficiently close to potential well 370 so that a photo-generated carrier within the light absorbing layer has a reasonable chance of diffusing to the potential well. In some cases, such as when re-emitting construction 340 includes no or an insufficient number of light absorbing layers, the potential well(s) in the re-emitting construction can be substantially light absorbing at the first wavelength $\lambda_1$.

First and second windows 320 and 360 are designed primarily to provide barriers so that carriers, such as electron-hole pairs, that are photo-generated in an absorbing layer do not, or have a small chance to, diffuse or otherwise migrate to a free or external surface, such as surface 322, of re-emitting construction 340. For example, first window 320 is designed, at least partially, to prevent carriers generated in first absorbing layer 330 as a result of absorbing light that is emitted by LED 120, from diffusing to surface 322 where they can recombine non-radiatively. In some cases, windows 320 and 360 have band gap energies that are greater than the energy of a photon emitted by LED 120. In such cases, windows 320 and 360 are substantially optically transparent to light emitted by LED 120 and light re-emitted by potential well 370. For example, in such cases, the optical transmittance of windows 320 and 360 at the first wavelength $\lambda_1$ or second wavelength $\lambda_2$ is at least 60%, or at least 70%, or at least 80%, or at least 90%, or at least 95%.

The exemplary re-emitting construction 340 of FIG. 3 includes two windows. In general, a light converting layer can have no, one, two or more windows. For example, in some cases, re-emitting construction 340 can have a single window disposed between LED 120 and potential well 370, or between LED 120 and light absorbing layer 330.

In some cases, the location of an interface between two adjacent layers in re-emitting construction 340 may be a well-defined or sharp interface. In some cases, such as when the material composition within a layer changes as a function of distance along the thickness direction, the interface between two adjacent layers may not be well defined and may, for example, be a graded interface. For example, in some cases, first absorbing layer 330 and first window 320 can have the same material components but with different material concentrations. In such cases, the material composition of the absorbing layer may be gradually changed to the material composition of the window layer resulting in a graded interface between the two layers. For example, in cases where both layers include Mg, the concentration of Mg can be increased when gradually transitioning from the absorbing layer to the window.

The exemplary re-emitting construction 340 includes a single potential well 370 located between two light absorbing layers 330 and 350. In general, re-emitting construction 340 can have one or more potential wells. In some cases, a potential well in re-emitting construction 340 is placed between and is immediately adjacent to two layers with larger band gap energies, where at least one of the two layers is substantially light absorbing at the first wavelength $\lambda_1$.

In some cases, re-emitting construction 340 can include layers other than those explicitly shown in FIG. 3. For example, re-emitting construction 340 can include a strain-compensation layer, such as a II-VI strain-compensation layer, for compensating or alleviating strain in re-emitting construction 340. A strain-compensation layer can, for example, be placed in between potential well 370 and first absorbing layer 330 and/or second absorbing layer 350. A strain-compensation layer can include, for example, ZnSSe and/or BeZnSe.

Referring back to FIG. 1, substrate 105 can include any material that may be suitable in an application. For example, substrate 105 may include or be made of Si, Ge, GaAs, GaN, InP, sapphire, SiC and ZnSe. In some cases, substrate 105 can be a Si substrate, a GaN substrate, or a SiC substrate. In some cases, substrate 105 may be n-doped, p-doped, insulating, or semi-insulating, where the doping may be achieved by any suitable method and/or by inclusion of any suitable dopant.

In some cases, LED 120 can be detached from re-emitting construction 140. In some cases, it may be desirable to attach the two by using, for example, bonding layer 130. In general, LED 120 can be attached or bonded to re-emitting construction 140 by any suitable method such as by an adhesive such as a hot melt adhesive, welding, pressure, heat or any combinations of such methods or other methods that may be desirable in an application. Examples of suitable hot melt adhesives include semicrystalline polyolefins, thermoplastic polyesters, and acrylic resins.

Other exemplary bonding materials include optically clear polymeric materials, such as optically clear polymeric adhesives, including acrylate-based optical adhesives, such as Norland 83H (supplied by Norland Products, Cranbury, N.J.); cyanoacrylates such as Scotch-Weld instant adhesive (supplied by 3M Company, St. Paul, Minn.); benzocyclobutenes such as Cyclotene™ (supplied by Dow Chemical Company, Midland, Mich.); clear waxes such as CrystalBond (Ted Pella Inc., Redding Calif.); liquid, water, or soluble glasses based on sodium silicate; and spin-on glasses (SOG).

In some cases, LED 120 can be attached to re-emitting construction 140 by a wafer bonding technique described in, for example, chapters 4 and 10 of "Semiconductor Wafer Bonding" by Q.-Y. Tong and U. Gosele (John Wiley & Sons, New York, 1999).

Figure 4:
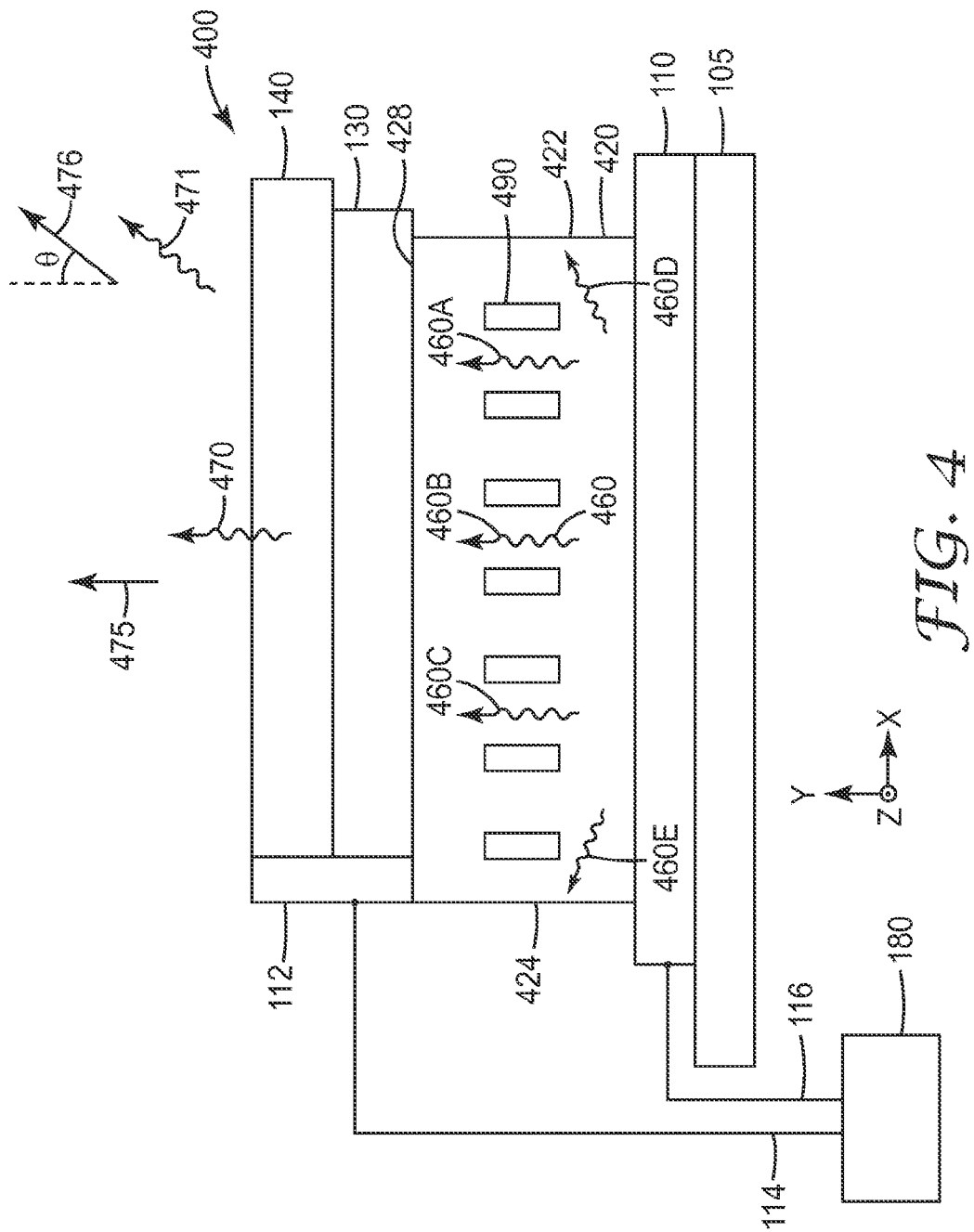
FIG. 4 is a schematic side-view of another light emitting system.

FIG. 4 is a schematic side-view of a light emitting system 400 that includes an LED 420 having an active top surface 428, a first side 422 and a second side 424. The LED is capable of emitting light 460 at the first wavelength $\lambda_1$ and includes an internal pattern 490 (internal to the LED) designed to enhance emission of light by the LED along one or more pre-determined directions, such as along the general y-direction, and suppress emission of light along other directions, such as along the general x- and z-directions, where the predetermined and other directions may be different for different applications. In the exemplary light emitting system 400, pattern 490 is designed to enhance or increase emission of light from active top surface 428 of the LED. Pattern 490 is further designed to reduce or suppress emission of light from one or more sides of the LED. For example, pattern 490 enhances emissions of light rays 460A, 460B and 460C along the y-axis so that the rays exit the LED from top surface 428 and suppresses emission of light ray 460D from first side 422 and light ray 460E from second side 424.

Pattern 490 can be any pattern capable of enhancing the emission of light primarily along one or more pre-determined directions and suppressing the emission of light along one or more other pre-determined directions. Some exemplary patterns are described in, for example, U.S. Pat. Nos. 5,955,749 and 6,831,302 both of which are incorporated herein by reference. In some cases, pattern 490 can be a phase pattern, meaning that the pattern is at least primarily a refractive index pattern. In such cases, the index of refraction changes along one or more directions resulting in the formation of a pattern. In some cases, pattern 490 can be at least primarily a layer-thickness or surface-relief pattern. In such cases, the thickness of one or more layer changes along one or more directions resulting in the formation of a relief or thickness pattern. For example, in some cases, pattern 490 can be a phase or thickness grating, such as a square or sinusoidal phase or thickness grating.

In some cases, a thickness or relief pattern can be formed by etching the pattern in one or more layers. In some cases, the etching can be completely through one or more regions of one or more layers. In some cases, LED 420 includes multiple layers and pattern 490 is a thickness pattern in one or more layers of the LED.

In some cases, pattern 490 can be a periodic pattern. For example, pattern 490 can be a periodic dielectric constant pattern. In some cases, pattern 490 can be aperiodic or quasi-periodic. In some cases, pattern 490 can be a one-dimensional or line pattern, a two-dimensional or surface pattern, or a three-dimensional or volume pattern, or any combinations thereof.

Figure 5:
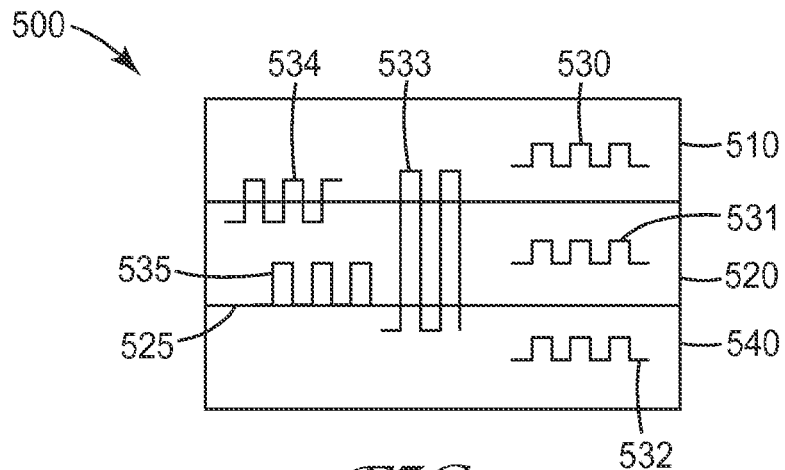
FIG. 5 is a schematic side-view of a Light Emitting Diode (LED) having patterns at different locations.

Pattern 490 can be in different locations within LED 420 where, in general, the LED can include one or more p-type and/or n-type semiconductor layers, one or more active emitting layers that may include one or more potential and/or quantum wells, one or more buffer layers, and any other layers that may be desirable in an application. For example, FIG. 5 is a schematic side-view of an LED 500 that includes an n-doped upper cladding layer 510, a quantum well 520, and a p-doped lower cladding layer 540. FIG. 5 shows a single quantum well (SQW) structure. In some cases, LED 500 can include multiple quantum wells (MQW) not shown explicitly in FIG. 5. In some cases, pattern 490 may be entirely within one layer in the LED. For example, pattern 530 is entirely within upper cladding layer 510, pattern 531 is entirely within quantum well 520, and pattern 532 is entirely within lower cladding layer 540. In some cases, such as in the case of pattern 520, a potential or quantum well within the LED includes the entire pattern. In some cases, the entire pattern 490 can be included within two or more immediately adjacent layers, meaning that, for example, one layer includes a portion of the pattern and an immediately adjacent layer includes the remaining portion of the pattern. For example, pattern 534 is entirely within immediately adjacent layers 510 and 520. As another example, pattern 533 is entirely within immediately adjacent layers 510, 520 and 540. In some cases, pattern 490 can be at an interface within the LED. For example, pattern 535 is at interface 525 between layers 520 and 540.

Figure 6A:
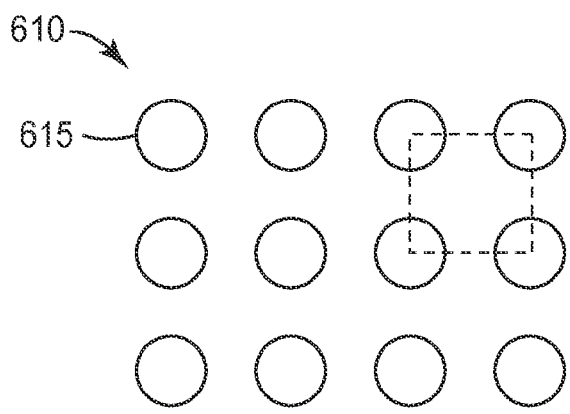
FIGS. 6A and 6B are schematic top-views of a rectangular and a triangular pattern, respectively.
Figure 6B:
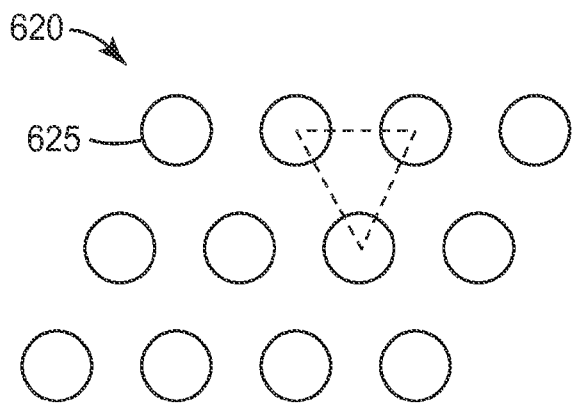

In some cases, pattern 490 can form a triangular, square, or rectangular array. For example, pattern 610 in FIG. 6A forms a rectangular array of elements 615, and pattern 620 in FIG. 6B forms a triangular array of elements 625. In some cases, pattern 490 can be a superposition of two or more patterns or arrays.

Referring back to FIG. 4, re-emitting construction 140 can include a II-VI potential well, such as a Cd(Mg)ZnSe or ZnSeTe potential well. Re-emitting construction 140 receives light 460 at wavelength $\lambda_1$ that exits LED 420 and converts at least a portion of the received light to light 470 at the second wavelength $\lambda_2$. In some cases, a substantial portion of the first wavelength light that exits LED 420 and is received by re-emitting construction 140, exits the LED through active top surface 428 of the LED. For example, in such cases, at least 50%, or at least 60%, or at least 70%, or at least 80%, or at least 90%, or at least 95%, or at least 98% of first wavelength light 460 that exits LED 420 and is received by re-emitting construction 140, exits the LED through active top surface 428 of the LED.

In some cases, the light that exits light emitting system 400 is substantially monochromatic, meaning that the exiting light is substantially light at the second wavelength $\lambda_2$ and includes little or no first wavelength light at $\lambda_1$. In such cases, the integrated or total emission intensity of all light at the second wavelength $\lambda_2$ that exit light emitting system 400 is at least 4 times, or at least 10 time, or at least 20 times, or at least 50 times, the integrated or total emission intensity of all light at the first wavelength $\lambda_1$ that exit light emitting system 400.

In some cases, light exiting light emitting system 400 along different directions can have different spectral, such as color, properties. For example, light traveling along different directions can have different proportions of the first and second wavelengths light. For example, output light 470 can propagate substantially along a first direction 475 (y-axis) and output light 471 can propagate substantially along a second direction 476. In some cases, lights 470 and 471 can have different spectral properties. For example, light 470 can have a larger second wavelength content than light 471. In some cases, such as when pattern 490 causes emission primarily along the y-axis, lights 470 and 471 have substantially the same spectral characteristics. For example, in such cases, light 470 can have a first color $C_1$ with CIE color coordinates $u_1'$ and $v_1'$ and color coordinates $x_1$ and $y_1$ and light 471 can have a second color $C_2$ with color coordinates $u_2'$ and $v_2'$ and color coordinates $x_2$ and $y_2$, where colors $C_1$ and $C_2$ are substantially the same. In such cases, the absolute value of each of the differences between $u_1'$ and $u_2'$ and between $v_1'$ and $v_2'$ is no more than 0.01, or no more than 0.005, or no more than 0.004, or no more than 0.003, or no more than 0.002, or no more than 0.001, or no more than 0.0005; and the difference $\Delta(u',v')$ between colors $C_1$ and $C_2$ is no more than 0.01, or no more than 0.005, or no more than 0.004, or no more than 0.003, or no more than 0.002, or no more than 0.001, or no more than 0.0005.

In some cases, the angle θ between first and second directions 475 and 476, respectively, is not less than about 10 degrees, or not less than about 15 degrees, or not less than about 20 degrees, or not less than about 25 degrees, or not less than about 30 degrees, or not less than about 35 degrees, or not less than about 40 degrees, or not less than about 45 degrees, or not less than about 50 degrees, or not less than about 55 degrees, or not less than about 60 degrees, or not less than about 65 degrees, or not less than about 70 degrees.

Figure 8:
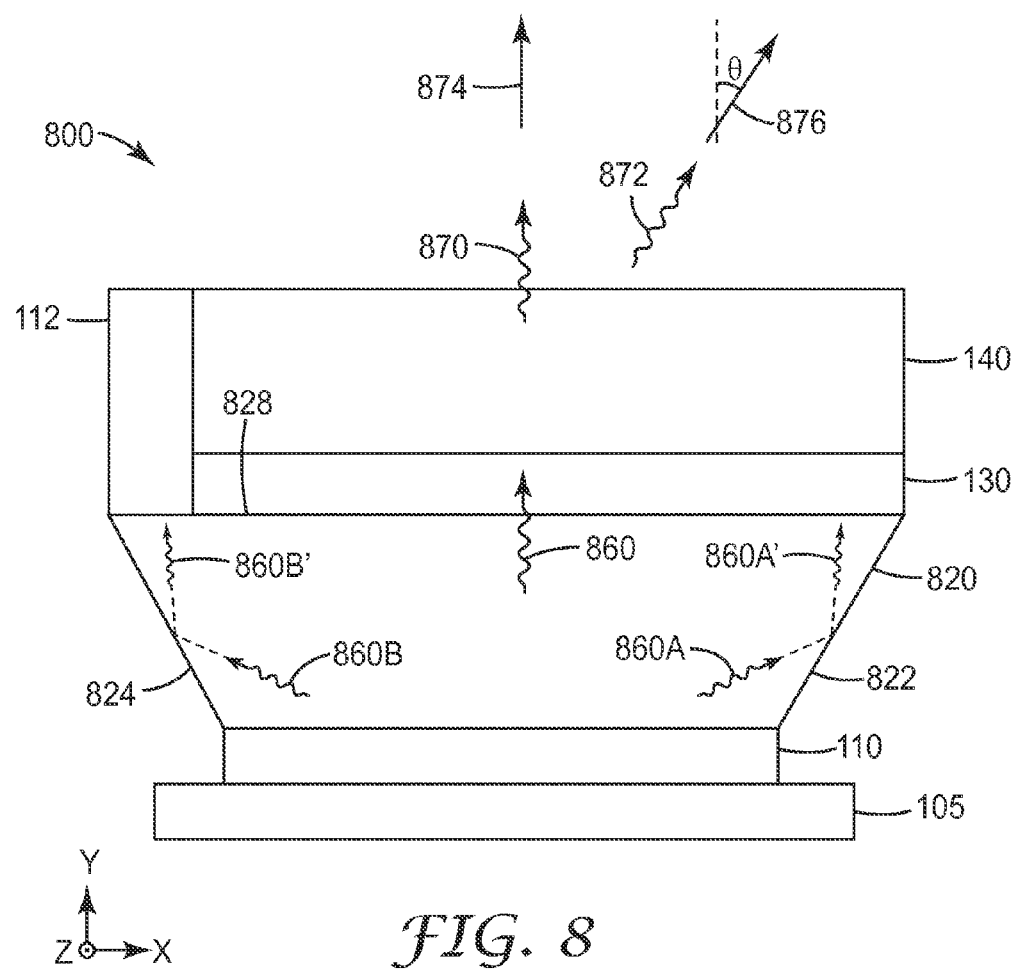
FIG. 8 is a schematic side-view of another light emitting system.

FIG. 8 is a schematic side-view of a light emitting system 800 that includes an electroluminescent device 820, such as an LED 820, that is capable of emitting light 860 at the first wavelength $\lambda_1$. LED 820 has a shape for enhancing emission of light at the first wavelength $\lambda_1$ from an active top surface 828 of the electroluminescent device and suppressing emission of light from other directions, such as one or more sides, such as sides 822 and 824, of the electroluminescent device.

In some cases, the shape of LED 820 is such that a substantial portion of the first wavelength light that propagates within LED 820 toward a side, such as side 822 or 824, of the LED is redirected towards active top surface 828. For example, LED 820 in FIG. 8 has a substantially trapezoidal cross-section in a plane, such as the xy-plane, normal to the top surface. The sides are so designed and situated that light ray 860A at wavelength $\lambda_1$ propagating towards first side 822 is redirected by side 822 towards top surface 828 as light ray 860A' and light ray 860B at wavelength $\lambda_1$ propagating towards second side 824 is redirected by side 824 towards top surface 828 as light ray 860B'.

In the exemplary light emitting system 800, LED 820 has the shape of a truncated cone or pyramid, where first side 822 is not parallel to second side 824. In general, LED 820 can have any shape that is capable of enhancing emission of light at the first wavelength $\lambda_1$ from active top surface 828 of LED 820 and suppressing emission of light from one or more sides, such as sides 822 and 824, of LED 820.

Light emitting system 800 further includes re-emitting construction 140 that includes a II-VI potential well, such as a Cd(Mg)ZnSe or ZnSeTe potential well, and receives the first wavelength light exiting LED 820 and converts at least a portion of the received light to light at the second wavelength $\lambda_2$. For example, re-emitting construction 140 receives light 860 at wavelength $\lambda_1$ that exits LED 820 and converts at least a portion of the received light to output light 870 at the second wavelength $\lambda_2$. In some cases, a substantial portion of the first wavelength light that exits LED 820 and is received by re-emitting construction 140, exits the LED through active top surface 828 of the LED. For example, in such cases, at least 50%, or at least 60%, or at least 70%, or at least 80%, or at least 90%, or at least 95%, or at least 98% of first wavelength light 860 that exits LED 820 and is received by re-emitting construction 140, exits the LED through active top surface 828 of the LED.

In some cases, the light that exits light emitting system 800 is substantially monochromatic, meaning that the exiting light is substantially light at the second wavelength $\lambda_2$ and includes little or no first wavelength light at $\lambda_1$. In such cases, the integrated or total emission intensity of all light at the second wavelength $\lambda_2$ that exits light emitting system 800 is at least 4 times, or at least 10 time, or at least 20 times, or at least 50 times the integrated or total emission intensity of all light at the first wavelength $\lambda_1$ that exit light emitting system 800.

In some cases, light exiting light emitting system 800 along different directions can have different spectral, such as color, properties. For example, light traveling along different directions can have different proportions of the first and second wavelengths light. For example, output light 870 propagating substantially along a first direction 874 (y-axis) and output light 872 propagating substantially along a second direction 876 can have different spectral properties. For example, light 870 can have a larger second wavelength content than light 872. In some cases, such as when sides 822 and 824 enhance emission primarily along the y-axis by redirecting light propagating along other directions, lights 870 and 872 have substantially the same spectral characteristics. For example, in such cases, light 870 can have a first color $C_1$ with CIE color coordinates $u_1'$ and $v_1'$ and color coordinates $x_1$ and $y_1$ and light 872 can have a second color $C_2$ with color coordinates $u_2'$ and $v_2'$ and color coordinates $x_2$ and $y_2$, where colors $C_1$ and $C_2$ are substantially the same. In such cases, the absolute value of each of the differences between $u_1'$ and $u_2'$ and between $v_1'$ and $v_2'$ is no more than 0.01, or no more than 0.005, or no more than 0.004, or no more than 0.003, or no more than 0.002, or no more than 0.001, or no more than 0.0005; and the difference $\Delta(u',v')$ between colors $C_1$ and $C_2$ is no more than 0.01, or no more than 0.005, or no more than 0.004, or no more than 0.003, or no more than 0.002, or no more than 0.001, or no more than 0.0005.

In some cases, the angle θ between first and second directions 874 and 876, respectively, is not less than about 10 degrees, or not less than about 15 degrees, or not less than about 20 degrees, or not less than about 25 degrees, or not less than about 30 degrees, or not less than about 35 degrees, or not less than about 40 degrees, or not less than about 45 degrees, or not less than about 50 degrees, or not less than about 55 degrees, or not less than about 60 degrees, or not less than about 65 degrees, or not less than about 70 degrees.

Figure 9:
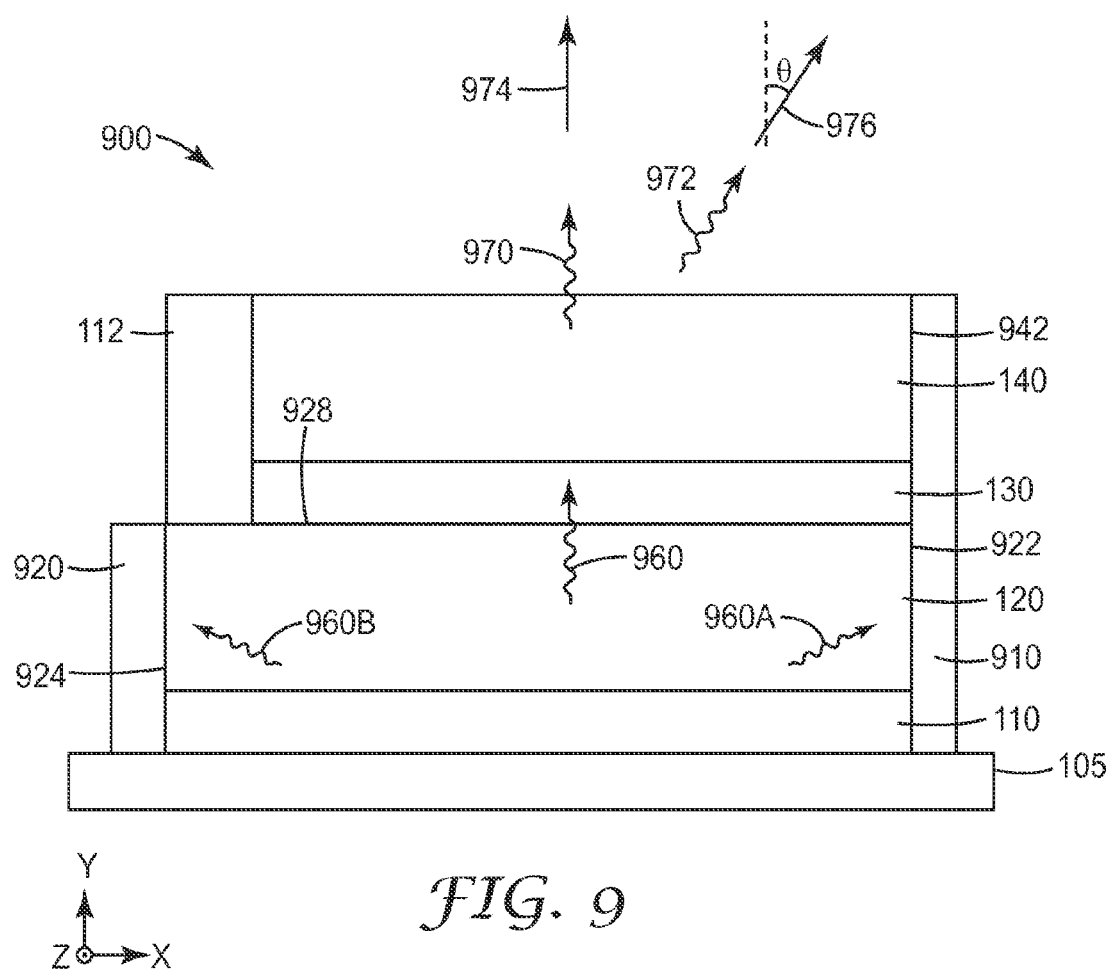
FIG. 9 is a schematic side-view of another light emitting system.

FIG. 9 is a schematic side-view of a light emitting system 900 that includes electroluminescent device 120, such as LED 120, that includes a first side 922, a second side 924, and an active top surface 928 and is capable of emitting light 960 at the first wavelength $\lambda_1$ from top surface 928. Light emitting system 900 further includes one or more light blocking constructions proximate or near a side of electroluminescent device 120 for blocking light at the first wavelength $\lambda_1$ that would otherwise exit the side. For example, light blocking construction 910 blocks emitted light 960A at the first wavelength $\lambda_1$ that would otherwise exit side 922 and light blocking construction 920 blocks emitted light 960B at the first wavelength $\lambda_1$ that would otherwise exit side 924. In some cases, light blocking constructions 910 and 920 can be discrete and separate constructions. In some cases, light blocking constructions 910 and 920 can be an integral part of a construction that blocks light from exiting one or more sides of the light emitting system.

Re-emitting construction 140 includes a II-VI potential well, such as a Cd(Mg)ZnSe or ZnSeTe potential well, and receives the first wavelength light 960 exiting the electroluminescent device from active top surface 928 and converts at least a portion of the received light to light 970 at the second wavelength $\lambda_2$.

Light blocking constructions 910 and 920 can block light that propagates sideways by any means that may be desirable and/or available in an application. For example, in some cases, light blocking constructions 910 and 920 block the light primarily by absorbing the light. Examples of light absorbing constructions include polymers such as various photoresists. In some other cases, light blocking constructions 910 and 920 block the light primarily by reflecting the light. Examples of light reflecting constructions include metals, such as silver or aluminum. In some cases, the constructions block the light partly by absorption and partly by reflection.

In some cases, one or more of light blocking constructions 910 and 920, can block light at the first wavelength $\lambda_1$, but not other wavelengths, in a predetermined wavelength range. For example, where first light 960 is a UV, violet or blue light and converted light 970 is a green or red light, light blocking constructions 910 and 920 may block the UV, violet or blue light, but not other lights in the visible range of the electromagnetic spectrum.

In some cases, light blocking constructions 910 and 920 are electrically insulative and can be directly attached to, or directly contacting, at least one electrode of the electroluminescent device. For example, for an electrically insulative light blocking construction 910, the construction can directly contact bottom electrode 110 and top electrode 112 (for example, through construction 920) without causing an electrical short between the two electrodes.

In some cases, light blocking constructions 910 and 920 block light exiting the sides of LED 120, but not the sides of other elements, such as re-emitting construction 140, in the light emitting system. In some cases, such as in the exemplary light emitting system 900, light blocking construction 910 extends upwards and covers side 942 of re-emitting construction 140. In such cases, light blocking construction 910 can block light at the first wavelength $\lambda_1$ and/or second wavelength $\lambda_2$ that would otherwise exit side 942 of the re-emitting semiconductor construction.

Figure 10:
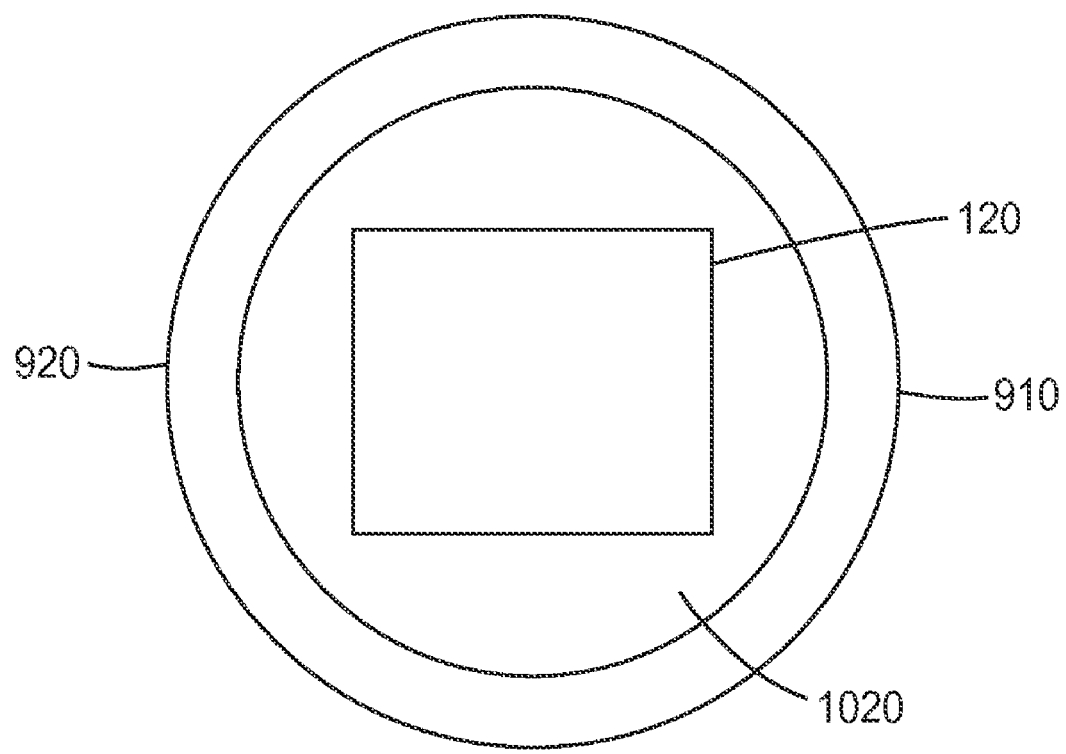
FIG. 10 is a schematic top-view of a light emitting system having an intermediate region between a light blocking construction and a side of the light emitting system.

In some cases, there is an intermediate region between a side of LED 120 and a light blocking construction that is proximate to the side. For example, FIG. 10 is a schematic top-view of light emitting system 900 that includes an intermediate region 1020 between light blocking constructions 910 and 920 and the four sides of LED 120.

In some cases, light that exits light emitting system 900 is substantially monochromatic, meaning that the exiting light is substantially light at the second wavelength $\lambda_2$ and includes little or no first wavelength light at $\lambda_1$. In such cases, the integrated or total emission intensity of all light at the second wavelength $\lambda_2$ that exits light emitting system 900 is at least 4 times, or at least 10 time, or at least 20 times, or at least 50 times the integrated or total emission intensity of all light at the first wavelength $\lambda_1$ that exit light emitting system 900.

In some cases, light exiting light emitting system 900 along different directions can have different spectral, such as color, properties. For example, light traveling along different directions can have different proportions of the first and second wavelengths light. For example, output light 970 propagating substantially along a first direction 974 (y-axis) and output light 972 propagating substantially along a second direction 976 can have different spectral properties. For example, light 970 can have a larger second wavelength content than light 972. In some cases, such as when light blocking constructions 910 and 920 block light 960 from exiting the light emitting system from the sides of the electroluminescent device, lights 970 and 972 have substantially the same spectral characteristics. For example, in some cases, light 970 can have a first color $C_1$ with CIE color coordinates $u_1'$ and $v_1'$ and color coordinates $x_1$ and $y_1$ and light 972 can have a second color $C_2$ with color coordinates $u_2'$ and $v_2'$ and color coordinates $x_2$ and $y_2$, where colors $C_1$ and $C_2$ are substantially the same. In such cases, the absolute value of each of the differences between $u_1'$ and $u_2'$ and between $v_1'$ and $v_2'$ is no more than 0.01, or no more than 0.005, or no more than 0.004, or no more than 0.003, or no more than 0.002, or no more than 0.001, or no more than 0.0005; and the difference $\Delta(u',v')$ between colors $C_1$ and $C_2$ is no more than 0.01, or no more than 0.005, or no more than 0.004, or no more than 0.003, or no more than 0.002, or no more than 0.001, or no more than 0.0005.

In some cases, the angle $\theta$ between first and second directions 974 and 976, respectively, is not less than about 10 degrees, or not less than about 15 degrees, or not less than about 20 degrees, or not less than about 25 degrees, or not less than about 30 degrees, or not less than about 35 degrees, or not less than about 40 degrees, or not less than about 45 degrees, or not less than about 50 degrees, or not less than about 55 degrees, or not less than about 60 degrees, or not less than about 65 degrees, or not less than about 70 degrees.

Figure 7:
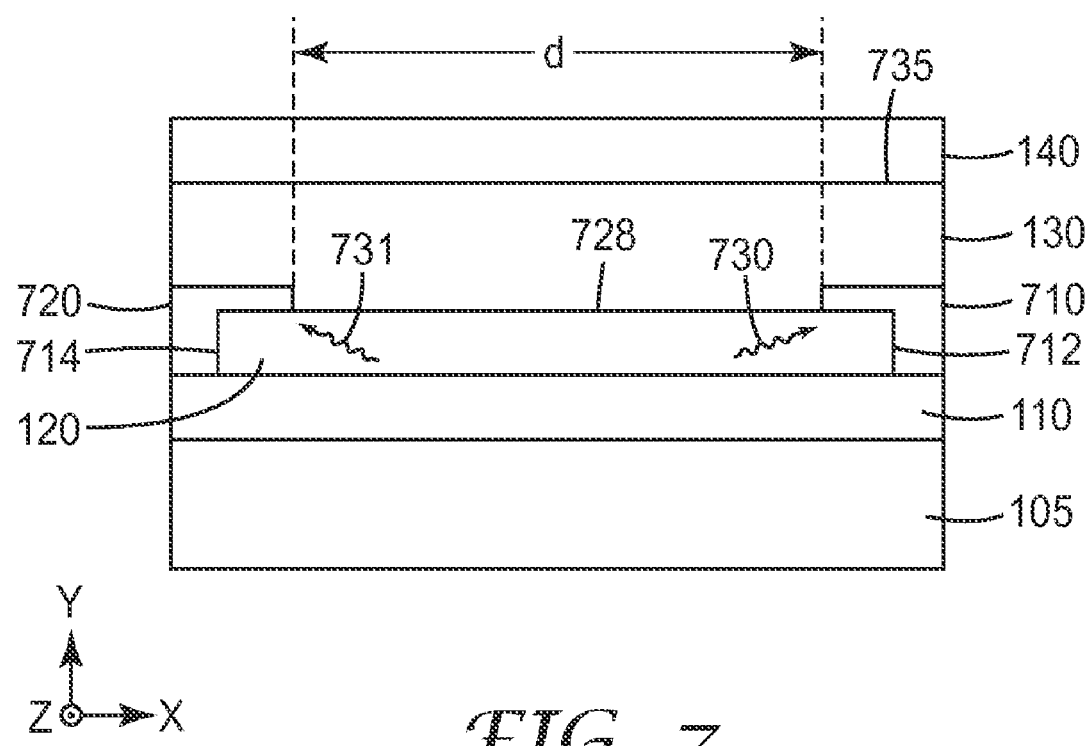
FIG. 7 is a schematic side-view of another light emitting system.

In some cases, a light blocking construction can also affect the size of an active light emitting surface. For example, in FIG. 7, light blocking construction 710 blocks light 730 from exiting LED 120 from side 712 of the LED, and light blocking construction 720 blocks light 731 from exiting LED 120 from side 714 of the LED. In addition to blocking side emission, light blocking constructions 710 and 720 also extend along a portion of top surface 728 of the LED, and by doing so, reduce the effective emitting surface of LED 120 to a smaller active top surface 728 with a smaller lateral dimension "d". In some cases, light blocking constructions 710 and 720 can include light absorbing polymers such as one or more photoresists.

Some of the advantages of the disclosed constructions are further illustrated by the following example. The particular materials, amounts and dimensions recited in this example, as well as other conditions and details, should not be construed to unduly limit the present invention.

EXAMPLE 1

An amber emitting light emitting system similar to light emitting system 100 was fabricated. An LED capable of emitting light at $\lambda_1$=455 nm was purchased from Epistar Corporation (Hsin Chu, Taiwan). The LED was an epitaxial AlGaInN-based LED bonded to a silicon wafer. Some portions of the top surface of the LED wafer were metalized with gold traces to spread the current and to provide pads for wire bonding.

A multilayer re-emitting semiconductor construction similar to re-emitting construction 140 was fabricated. The relative layer sequence and estimated values of material composition, thickness and bulk band gap energy are summarized in Table I.

A GaInAs buffer layer was first grown on an InP substrate by molecular beam epitaxy (MBE) to prepare the surface for subsequent II-VI growth. The coated substrate was then moved through an ultra-high vacuum transfer system to another MBE chamber for growth of different II-VI epitaxial layers. The re-emitting semiconductor construction included four CdZnSe quantum wells. Each quantum well was similar to potential well 340 and had a bulk energy gap ($E_g$) of about 2.09 eV. Each quantum well was sandwiched between two CdMgZnSe light absorbing layers similar to light absorbing layers 330 and 350. The light absorbing layers had an energy gap of about 2.48 eV and were capable of strongly absorbing the blue light emitted by the LED. The re-emitting semiconductor construction further included a window similar to window 360 and a grading layer between a light absorbing layer and the window layer. The material composition of the grading layer gradually changed from the material composition of the light absorbing layer on the light absorbing side to the material composition of the window on the window side.

TABLE I

Details of various layers in the construction of Example 1:

| Layer No. | Material | Thickness (Å) | Band Gap (eV) | Description |
|---|---|---|---|---|
| 1 | InP | — | — | Substrate |
| 2 | $Ga_{0.47}In_{0.53}As$ | 2000 | 0.77 | Buffer |
| 3 | $Cd_{0.38}Mg_{0.21}Zn_{0.41}Se$: Cl | 10924 | 2.48 | Absorber |
| 4 | $Cd_{0.53}Zn_{0.47}Se$ | 56 | 2.09 | Quantum well |
| 5 | $Cd_{0.38}Mg_{0.21}Zn_{0.41}Se$: Cl | 1178 | 2.48 | Absorber |
| 6 | $Cd_{0.53}Zn_{0.47}Se$ | 56 | 2.09 | Quantum well |
| 7 | $Cd_{0.38}Mg_{0.21}Zn_{0.41}Se$: Cl | 1178 | 2.48 | Absorber |
| 8 | $Cd_{0.53}Zn_{0.47}Se$ | 56 | 2.09 | Quantum well |
| 9 | $Cd_{0.38}Mg_{0.21}Zn_{0.41}Se$: Cl | 1178 | 2.48 | Absorber |
| 10 | $Cd_{0.53}Zn_{0.47}Se$ | 56 | 2.09 | Quantum well |
| 11 | $Cd_{0.38}Mg_{0.21}Zn_{0.41}Se$: Cl | 1178 | 2.48 | Absorber |
| 12 | Absorber side: $Cd_{0.38}Mg_{0.21}Zn_{0.41}Se$ Window side: $Cd_{0.22}Mg_{0.45}Zn_{0.33}Se$ | 2500 | 2.48-2.93 | Grading Layer |
| 13 | $Cd_{0.22}Mg_{0.45}Zn_{0.33}Se$ | 5000 | 2.93 | Window |

Next, the window side of the re-emitting construction was bonded to the emission or top surface of the LED using a bonding layer similar to bonding layer 130. The bonding layer was Norland optical adhesive 83H obtained from Norland Products, Inc. (Cranbury, N.J.). The thickness of the bonding layer was in a range from about 4 microns to about 8 μm.

The InP substrate was next removed with a solution of $3HCl:1H_2O$. The etchant stopped at the GaInAs buffer layer. The buffer layer was subsequently removed in an agitated solution of 30 ml ammonium hydroxide (30% by weight), 5 ml hydrogen peroxide (30% by weight), 40 g adipic acid, and 200 ml water, leaving only the II-VI re-emitting construction adhesively attached to the LED.

Vias were then etched through the re-emitting construction and the bonding layer in order to make electrical contact to the gold coated portions of the top surface of the LED. The vias were made by conventional contact photolithography using a negative photoresist (NR7-1000PY from Futurrex, Franklin, N.J.). In making the vias, the II-VI layers in the re-emitting construction were etched by immersing the construction for 2.5 minutes in a solution of $240H_2O:40HBr:1Br_2$ by volume, and the bonding layer was etched by exposing the construction to an oxygen plasma at a pressure of 15 mTorr, an RF power of 80 W and an inductive coupling plasma power of 1200 W for 12 minutes in a plasma reactive ion etching system from Oxford Instruments (Oxfordshire, UK). The oxygen plasma also removed the patterned negative photoresist layer.

Figure 11:
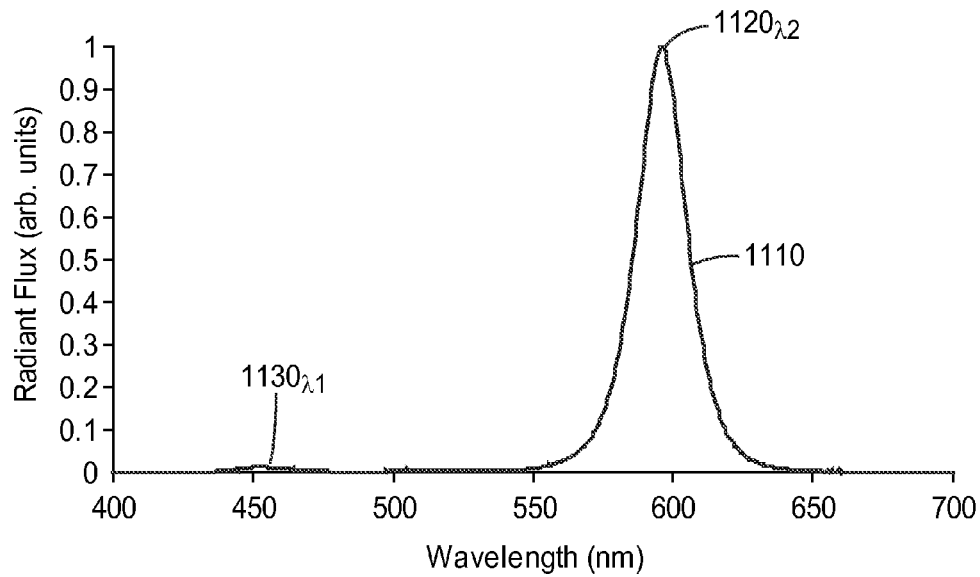
FIG. 11 is a plot of the output spectrum of a light emitting system as a function of wavelength.

FIG. 11 shows the on-axis (that is, θ=0 degrees in for example, FIG. 1) output spectrum 1110 of the resulting light emitting system when the LED was driven with a 350 mA and 20 msec pulse. The light emitting system had a converted peak emission 1120 at the second wavelength $\lambda_2$=597 nm and a residual peak emission 1130 at the first wavelength $\lambda_1$=455 nm. Approximately 1.3% of the output light was at the first wavelength, meaning that the output flux at 455 nm was about 1.3% of the total flux emitted by the light emitting system and the output flux at 597 nm was about 98.7% of the total flux emitted by the light emitting system. The average percent output light at 455 for a second similarly constructed light emitting systems was approximately 1.43%. The total emission intensity of all light at 579 nm that exited the light emitting system 900 was about 70 times the total emission intensity of all light at 455 nm that exited the light emitting system. $W_{min}$ was 1 mm and $T_{max}$ was 8 microns resulting in a ration $W_{min}/T_{max}$ of 125.

Figure 12:
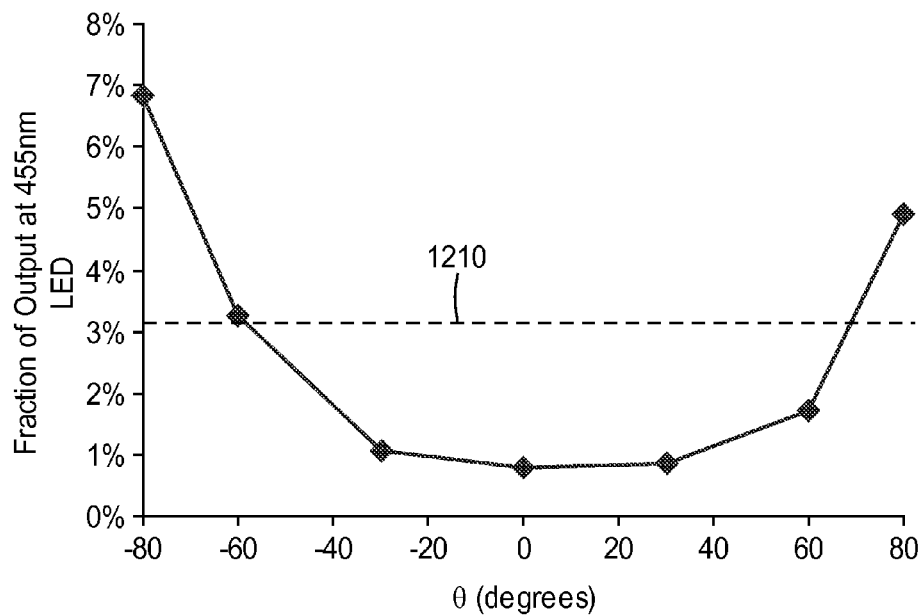
FIG. 12 is a plot of percent output light of a light emitting system as a function of propagation direction.

FIG. 12 shows percent output light at 455 nm for different propagation directions as defined by angle θ described elsewhere in reference to, for example, FIG. 2. The horizontal line 1210 is the 60 degree line and indicates that for θ less than about 60 degrees, the percent output light at 455 nm is less than about 3.4%.

Figure 13:
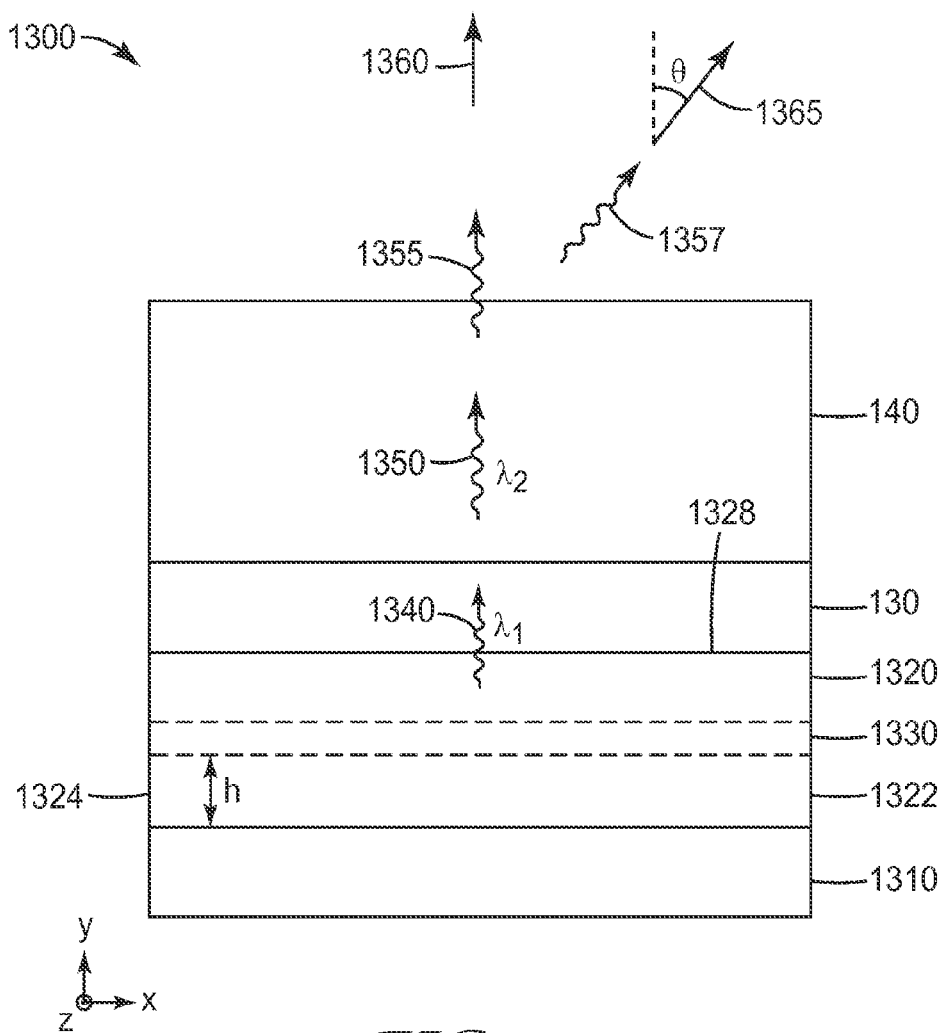
FIG. 13 is a schematic side-view of another light emitting system.

FIG. 13 is a schematic side-view of a light emitting system 1300 that includes an electroluminescent device 1320 disposed on a light reflector 1310 and capable of emitting light 1340 at the first wavelength $\lambda_1$, re-emitting construction 140, and an optional bonding layer for bonding electroluminescent device 1320 to re-emitting construction 140.

Electroluminescent device 1320, such as an LED 1320, includes an active region 1330 where emission of photons at the wavelength $\lambda_1$ primarily takes place. In some cases, such as when the electroluminescent device in an LED, the active region includes one or more potential wells and/or quantum wells. In some cases, the distance "h" between active region 1330 and reflector 1310 is so chosen that it enhances optical cavity effects in the electroluminescent device as described in Shen et al., "Optical cavity effects in InGaN/GaN quantum-well-heterostructure flip-chip light-emitting diodes," Applied Physics Letters, Vol. 82, No. 14, pp. 2221-2223 (2003). In such cases, the optical cavity effects enhance emission of light at the first wavelength $\lambda_1$ from an active top surface 1328 of the electroluminescent device and suppress emission of light from other directions, such as one or more sides, such as sides 1322 and 1324, of the electroluminescent device. In such cases, the distance "h" is such that a substantial portion of the first wavelength light that exits the electroluminescent device exits from top surface 1328 of the electroluminescent device. For example, in such cases, at least 70%, or at least 80%, or at least 90%, or at least 95% of light at wavelength $\lambda_1$ that exits the electroluminescent device goes through the top surface 1328 towards re-emitting construction 140. For example, in such cases, the distance "h" can be in a range from about $0.6\lambda_1$ to about $1.4\lambda_1$, or in a range from about $0.6\lambda_1$ to about $0.8\lambda_1$, or in a range from about $1.2\lambda_1$ to about $1.4\lambda_1$.

Re-emitting construction 140 includes a II-VI potential well, such as a Cd(Mg)ZnSe or ZnSeTe potential well, and receives the first wavelength light 1340 exiting electroluminescent device 1320 and converts at least a portion of the received light to light 1350 at the second wavelength $\lambda_2$. In some cases, the light that exits light emitting system 1300 is substantially monochromatic, meaning that the exiting light is substantially light at the second wavelength $\lambda_2$ and includes little or no first wavelength light at $\lambda_1$. In such cases, the integrated or total emission intensity of all light at the second wavelength $\lambda_2$ that exits light emitting system 1300 is at least 4 times, or at least 10 time, or at least 20 times, or at least 50 times the integrated or total emission intensity of all light at the first wavelength $\lambda_1$ that exit light emitting system 1300.

In some cases, light exiting light emitting system 1300 along different directions can have different spectral, such as color, properties. For example, light traveling along different directions can have different proportions of the first and second wavelengths light. For example, output light 1355 propagating substantially along a first direction 1360 (y-axis) and output light 1357 propagating substantially along a second direction 1365 can have different spectral properties. For example, light 1357 can have a larger second wavelength content than light 1355. In some cases, such as when distance "h" is so selected to enhance emission of light by the electroluminescent device primarily along the y-axis, lights 1355 and 1357 have substantially the same spectral characteristics. For example, in such cases, light 1355 can have a first color $C_1$ with CIE color coordinates $u_1'$ and $v_1'$ and color coordinates $x_1$ and $y_1$ and light 1357 can have a second color $C_2$ with color coordinates $u_2'$ and $v_2'$ and color coordinates $x_2$ and $y_2$, where colors $C_1$ and $C_2$ are substantially the same. In such cases, the absolute value of each of the differences between $u_1'$ and $u_2'$ and between $v_1'$ and $v_2'$ is no more than 0.01, or no more than 0.005, or no more than 0.004, or no more than 0.003, or no more than 0.002, or no more than 0.001, or no more than 0.0005; and the difference $\Delta(u',v')$ between colors $C_1$ and $C_2$ is no more than 0.01, or no more than 0.005, or no more than 0.004, or no more than 0.003, or no more than 0.002, or no more than 0.001, or no more than 0.0005.

In some cases, the angle θ between first and second directions 1360 and 1365, respectively, is not less than about 10 degrees, or not less than about 15 degrees, or not less than about 20 degrees, or not less than about 25 degrees, or not less than about 30 degrees, or not less than about 35 degrees, or not less than about 40 degrees, or not less than about 45 degrees, or not less than about 50 degrees, or not less than about 55 degrees, or not less than about 60 degrees, or not less than about 65 degrees, or not less than about 70 degrees.

In general, light reflector 1310 can be any light reflector capable of reflecting light at wavelength $\lambda_1$. For example, in some cases, light reflector 1310 can be a metal reflector containing a metal, such as silver, gold or aluminum. As another example, in some cases, reflector 1310 can be a Bragg reflector.

In some cases, such as when electroluminescent device 1320 is an LED, light reflector 1310 can be a current spreader electrode for the electroluminescent device. In such cases, light reflector 1310 can laterally (x- and z-directions) spread an applied electric current across the electroluminescent device.

In some cases, light reflector 1310 is substantially reflective at the first wavelength. For example, in such cases, the reflectance of light reflector 1310 at the first wavelength $\lambda_1$ is at least 80%, or at least 90%, or at least 95%, or at least 99%, or at least 99.5%, or at least 99.9%. In some cases, light reflector 1310 is substantially reflective at the second wavelength $\lambda_2$. For example, in such cases, the reflectance of light reflector 1310 at the second wavelength $\lambda_2$ is at least 80%, or at least 90%, or at least 95%, or at least 99%, or at least 99.5%, or at least 99.9%.

As used herein, terms such as "vertical", "horizontal", "above", "below", "left", "right", "upper" and "lower", "top" and "bottom" and other similar terms, refer to relative positions as shown in the figures. In general, a physical embodiment can have a different orientation, and in that case, the terms are intended to refer to relative positions modified to the actual orientation of the device. For example, even if the construction in FIG. 12 is rotated 90 degrees, line 1210 is still considered to be a "horizontal" line.

While specific examples of the invention are described in detail above to facilitate explanation of various aspects of the invention, it should be understood that the intention is not to limit the invention to the specifics of the examples. Rather, the intention is to cover all modifications, embodiments, and alternatives falling within the spirit and scope of the invention as defined by the appended claims.

What is claimed is:

1. A light emitting system, comprising:
an LED emitting light at a first wavelength, a primary portion of the emitted first wavelength light exiting the LED from a top surface of the LED having a minimum lateral dimension $W_{min}$, the remaining portion of the emitted first wavelength light exiting the LED from one or more sides of the LED having a maximum edge thickness $T_{max}$, the ratio $W_{min}/T_{max}$ being at least 30; and
a re-emitting semiconductor construction comprising a semiconductor potential well and receiving the first wavelength light exiting the LED from the top surface and converting at least a portion of the received light to light of a second wavelength, wherein an integrated emission intensity of all light at the second wavelength exiting the light emitting system is at least 4 times an integrated emission intensity of all light at the first wavelength exiting the light emitting system.

2. The light emitting system of claim 1, wherein light emitted by the light emitting system along a first direction has a first set of color coordinates and light emitted by the light emitting system along a second direction has a second set of color coordinates substantially the same as the first set of color coordinates, and wherein an angle between the first and second directions is no less than 20 degrees.

3. The light emitting system of claim 2, wherein the angle between the first and second directions is no less than 40 degrees.

4. The light emitting system of claim 2, wherein the first set of color coordinates are $u_1'$ and $v_1'$ and the second set of color coordinates are $u_2'$ and $v_2'$, and wherein an absolute value of each of differences between $u_1'$ and $u_2'$ and between $v_1'$ and $v_2'$ is no more than 0.01.

5. The light emitting system of claim 4, wherein the absolute value of each of the differences between $u_1'$ and $u_2'$ and between $v_1'$ and $v_2'$ is no more than 0.005.

6. The light emitting system of claim 1, wherein the LED is a III-V LED.

7. The light emitting system of claim 1, wherein the top surface is a rectangle having a length L and a width W, the width being the minimum lateral dimension of the top surface.

8. The light emitting system of claim 1, wherein the ratio $W_{min}/T_{max}$ is at least 40.

9. The light emitting system of claim 1, wherein the ratio $W_{min}/T_{max}$ is at least 100.

10. The light emitting system of claim 1, wherein the semiconductor potential well comprises a II-VI material.

11. The light emitting system of claim 10, wherein the potential well comprises Cd(Mg)ZnSe or ZnSeTe.

12. The light emitting system of claim 1, wherein the first wavelength is blue and the second wavelength is green or red.

13. The light emitting system of claim 1, wherein the integrated emission intensity of all light at the second wavelength exiting the light emitting system is at least 10 times the integrated emission intensity of all light at the first wavelength exiting the light emitting system.

14. The light emitting system of claim 1, wherein the re-emitting semiconductor construction converts at least 20% of the received light to light of the second wavelength.

15. A light emitting system, comprising:
an electroluminescent device emitting light at a first wavelength and having a shape for enhancing emission of light from a top surface of the electroluminescent device and suppressing emission of light from one or more sides of the electroluminescent device; and
a re-emitting semiconductor construction comprising a II-VI potential well and receiving the first wavelength light exiting the electroluminescent device from the top surface and converting at least a portion of the received light to light of a second wavelength, wherein an integrated emission intensity of all light at the second wavelength exiting the light emitting system is at least 4 times an integrated emission intensity of all light at the first wavelength exiting the light emitting system.

16. The light emitting system of claim 15, wherein the shape of the electroluminescent device is such that a substantial portion of the first wavelength light propagating within the electroluminescent device toward a side of the electroluminescent device is redirected toward the top surface.

17. The light emitting system of claim 15, wherein the electroluminescent device has a first side and a second side not parallel to the first side.

18. The light emitting system of claim 15, wherein the electroluminescent device has a substantially trapezoidal cross-section in a plane normal to the top surface.

19. The light emitting system of claim 15, wherein the electroluminescent device comprises an LED.

20. The light emitting system of claim 15, wherein the II-VI potential well comprises Cd(Mg)ZnSe or ZnSeTe.

* * * * *

UNITED STATES PATENT AND TRADEMARK OFFICE
CERTIFICATE OF CORRECTION

PATENT NO. : 8,193,543 B2  
APPLICATION NO. : 13/058315  
DATED : June 5, 2012  
INVENTOR(S) : Catherine A Leatherdale Page 1 of 1

It is certified that error appears in the above-identified patent and that said Letters Patent is hereby corrected as shown below:

<u>First Page, Column 2, Abstract</u>
Line 2, delete "wave-length." and insert -- wavelength. --, therefor.

<u>Column 1</u>
Line 33, delete "non -monochromatic" and insert -- non-monochromatic --, therefor.

<u>Column 9</u>
Line 37, delete "superstate" and insert -- superstrate --, therefor.

Signed and Sealed this

Eleventh Day of September, 2012

David J. Kappos
*Director of the United States Patent and Trademark Office*